US009466362B2

(12) United States Patent
Yu et al.

(10) Patent No.: US 9,466,362 B2
(45) Date of Patent: Oct. 11, 2016

(54) RESISTIVE CROSS-POINT ARCHITECTURE FOR ROBUST DATA REPRESENTATION WITH ARBITRARY PRECISION

(71) Applicants: Shimeng Yu, Tempe, AZ (US); Yu Cao, Gilbert, AZ (US); Jae-sun Seo, Tempe, AZ (US); Sarma Vrudhula, Chandler, AZ (US); Jieping Ye, Phoenix, AZ (US)

(72) Inventors: Shimeng Yu, Tempe, AZ (US); Yu Cao, Gilbert, AZ (US); Jae-sun Seo, Tempe, AZ (US); Sarma Vrudhula, Chandler, AZ (US); Jieping Ye, Phoenix, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 14/824,782

(22) Filed: Aug. 12, 2015

(65) Prior Publication Data
US 2016/0049195 A1 Feb. 18, 2016

Related U.S. Application Data

(60) Provisional application No. 62/036,396, filed on Aug. 12, 2014.

(51) Int. Cl.
*G11C 5/06* (2006.01)
*G11C 13/00* (2006.01)

(52) U.S. Cl.
CPC ......... *G11C 13/0026* (2013.01); *G11C 13/003* (2013.01); *G11C 13/0028* (2013.01); *G11C 13/0069* (2013.01); *G11C 5/06* (2013.01); *G11C 13/0002* (2013.01); *G11C 13/004* (2013.01);
(Continued)

(58) Field of Classification Search
CPC . G11C 5/06; G11C 13/0002; G11C 2213/79; G11C 5/02; G11C 13/003; G11C 2213/74

USPC .......................................... 365/148, 158, 163
See application file for complete search history.

(56) References Cited

U.S. PATENT DOCUMENTS

2005/0078531 A1* 4/2005 Lammers ................. 365/189.09
2008/0205119 A1* 8/2008 Nagai et al. .................. 365/148
(Continued)

OTHER PUBLICATIONS

Abbott, L.F., "Lapicque's introduction of the integrate-and-fire model neuron (1907)," Brain Research Bulletin, vol. 50, Issue 5/6, 1999, Elsevier Science Inc., pp. 303-304.
(Continued)

*Primary Examiner* — Ly D Pham
(74) *Attorney, Agent, or Firm* — Withrow & Terranova, P.L.L.C.

(57) ABSTRACT

This disclosure relates generally to resistive memory systems. The resistive memory systems may be utilized to implement neuro-inspired learning algorithms with full parallelism. In one embodiment, a resistive memory system includes a cross point resistive network and switchable paths. The cross point resistive network includes variable resistive elements and conductive lines. The conductive lines are coupled to the variable resistive elements such that the conductive lines and the variable resistive elements form the cross point resistive network. The switchable paths are connected to the conductive lines so that the switchable paths are operable to selectively interconnect groups of the conductive lines such that subsets of the variable resistive elements each provide a combined variable conductance. With multiple resistive elements in the subsets, process variations in the conductances of the resistive elements average out. As such, learning algorithms may be implemented with greater precision using the cross point resistive network.

17 Claims, 12 Drawing Sheets

(52) U.S. Cl.
CPC ....... *G11C 2213/74* (2013.01); *G11C 2213/77* (2013.01); *G11C 2213/79* (2013.01)

(56) References Cited

U.S. PATENT DOCUMENTS

| | | | | |
|---|---|---|---|---|
| 2011/0002156 | A1* | 1/2011 | Murooka | 365/148 |
| 2011/0211391 | A1* | 9/2011 | Parkinson | 365/163 |
| 2013/0285699 | A1* | 10/2013 | McWilliams et al. | 326/41 |
| 2015/0091859 | A1* | 4/2015 | Rosenberg et al. | 345/174 |

OTHER PUBLICATIONS

Aharon, Michal, et al., "K-SVD: An Algorithm for Designing Overcomplete Dictionaries for Sparse Representation," IEEE Transactions on Signal Processing, vol. 54, Issue 11, Nov. 2006, IEEE, pp. 4311-4322.

Balakrishnan, Suhrid, et al., "Algorithms for Sparse Linear Classifiers in the Massive Data Setting," Journal of Machine Learning Research, vol. 9, Feb. 2008, pp. 313-337.

Beck, Amir, et al., "A Fast Iterative Shrinkage—Thresholding Algorithm for Linear Inverse Problems," Version 2, Mar. 2009, Society for Industrial and Applied Mathematics, pp. 183-202.

Bi, Guo-Qiang, et al., "Synaptic Modifications in Cultured Hippocampal Neurons: Dependence on Spike Timing, Synaptic Strength, and Postsynaptic Cell Type," The Journal of Neuroscience, vol. 18, Issue 24, Dec. 1998, pp. 10464-10472.

Bottou, Leon, et al., "The Tradeoffs of Large Scale Learning," Optimization for Machine Learning, 2011, MIT Press, 8 pages.

Daubechies, Ingrid, et al., "An iterative thresholding algorithm for linear inverse problems with a sparsity constraint," arXiv:math/0307152v2, Version 2, Nov. 2, 2003, 30 pages.

Donoho, David, et al., "Optimally Sparse Representation in General (non-Orthogonal) Dictionaries via L1 Minimization," Proceedings of the National Academy of Sciences, vol. 100, Issue 5, 2003, 19 pages.

Dundar, Aysegul, et al., "Accelerating Deep Neural Networks on Mobile Processor with Embedded Programmable Logic," Presentation Poster, Neural Information Processing Systems Demonstration, 2013, 1 page.

Efron, Bradley, et al., "Least Angle Regression," The Annals of Statistics, vol. 32, Issue 2, 2004, Institute of Mathematical Statistics, pp. 407-499.

Farabet, Clement, et al., "Hardware Accelerated Convolutional Neural Networks for Synthetic Vision Systems," Proceedings of the IEEE International Symposium on Circuits and Systems, May 30-Jun. 2, 2010, Paris, France, IEEE, 4 pages.

Hoyer, Patrik, "Non-negative Sparse Coding," Proceedings of the IEEE Workshop on Neural Networks for Signal Processing, Feb. 2002, IEEE, 9 pages.

Hu, Miao, et al., "Memristor Crossbar Based Hardware Realization of BSB Recall Function," World Congress on Computational Intelligence, Jun. 10-15, 2012, Brisbane, Australia, IEEE, 7 pages.

Jo, S.H., et al., "Nanoscale Memristor Device as Synapse in Neuromorphic Systems," Nano Letters, vol. 10, Issue 4, Feb. 2010, American Chemical Society, 5 pages.

Lecun, Yann, et al., "The MNIST Database of handwritten digits," accessed online at yann.lecun.com/exdb/mnist, published at least as early as Jul. 15, 2014, 8 pages.

Lee, Honglak, et al., "Efficient sparse coding algorithms," Advances in neural information processing systems, 2006, 8 pages.

Lee, Honglak, et al., "Exponential Family Sparse Coding with Applications to Self-taught Learning," Proceedings of the 21st International Joint Conference on Artificial Intelligence, Jul. 2009, Morgan Kaufmann Publishers Inc., 7 pages.

Mairal, Julien, et al., "Online Dictionary Learning for Sparse Coding," Proceedings of the 26th International Conference on Machine Learning, 2009, Montreal, Canada, 8 pages.

Olshausen, Bruno, et al., "Emergence of simple-cell receptive field properties by learning a sparse code for natural images," Letters to Nature, vol. 381, Jun. 1996, pp. 607-609.

Olshausen, Bruno, et al., "Sparse coding of sensory inputs," Current Opinion in Neurobiology, vol. 14, Jul. 2004, Elsevier Ltd., pp. 481-487.

Raina, Rajat, et al., "Large-scale Deep Unsupervised Learning using Graphics Processors," Proceedings of the 26th International Conference on Machine Learning, 2009, Montreal, Canada, 8 pages.

Seo, Jae-Sun, et al., "A 45nm CMOS Neuromorphic Chip with a Scalable Architecture for Learning in Networks of Spiking Neurons," Custom Integrated Circuits Conference (CICC), Sep. 19-21, 2011, San Jose, California, IEEE, 4 pages.

Smith, Evan, et al., "Efficient auditory coding," Nature Letters, vol. 439, Feb. 23, 2006, Nature Publishing Group, pp. 978-982.

Song, Sen, et al., "Competitive Hebbian learning through spike-timing-dependent synaptic plasticity," Nature Neuroscience, vol. 3, Issue 9, Sep. 2000, Nature America Inc., pp. 919-926.

Szlam, Arthur, et al., "Fast approximations to structured sparse coding and applications to object classification," Proceedings of the 12th Conference on Computer Vision, Oct. 7-13, 2012, Florence, Italy, Springer Berlin Heidelberg, 14 pages.

Tosic, Ivana, et al., "Dictionary Learning: What is the right representation for my signal?," IEEE Signal Processing Magazine, Mar. 2011, IEEE, pp. 27-38.

Wu, Tong, et al., "Coordinate Descent Algorithms for Lasso Penalized Regression," The Annals of Applied Statistics, vol. 2, Issue 1, Mar. 2008, Institute of Mathematical Statistics, 22 pages.

Yu, Shimeng, et al., "A Low Energy Oxide-Based Electronic Synaptic Device for Neuromorphic Visual Systems with Tolerance to Device Variation," Advanced Materials, vol. 25, 2013, Wiley-VCH Verlag GmbH & Co., 1774-1779.

Liang, Jiale, et al., "Effect of Wordline/Bitline Scaling on the Performance, Energy Consumption, and Reliability of Cross-Point Memory Array," ACM Journal on Emerging Technologies in Computing Systems, vol. 9, Issue 1, Feb. 2013, ACM, 14 pages.

Rajendran, Bipin, et al., "Specifications of Nanoscale Devices and Circuits for Neuromorphic Computational Systems," IEEE Transactions on Electon Devices, vol. 60, Issue 1, Jan. 2013, IEEE, pp. 246-253.

Wang, Zhenhua, "CMOS Adjustable Schmitt Triggers," IEEE Transactions on Instrumentation and Measurement, vol. 40, Issue 3, Jun. 1991, IEEE, pp. 601-605.

\* cited by examiner

| OPERATION | PARCA METHOD |
|---|---|
| $D \cdot Z$ | $IZS_{(i)} = \sum_i G_{ij} \cdot VWS_{(j)}$ |
| $D^T \cdot r$ | $IZS_{(j)} = \sum_j G_{ij} \cdot VBS_{(i)}$ |
| D UPDATE | $\Delta G_{ij} = \eta \cdot r_i \cdot Z_j$ |
| READ | INPUT: SMALL $V$ PULSE; OUTPUT: $I$ to DIGITAL |
| WRITE | INPUT: LARGE $VB$ AND $VW$ PULSE, WITH PROPER TIMING BETWEEN THEM |

FIG. 2

RESISTIVE CROSS-POINT ARCHITECTURE FOR ROBUST DATA REPRESENTATION WITH ARBITRARY PRECISION

RELATED APPLICATIONS

This application claims the benefit of provisional patent application Ser. No. 62/036,396, filed Aug. 12, 2014, the disclosure of which is hereby incorporated herein by reference in its entirety.

FIELD OF THE DISCLOSURE

This disclosure relates generally to resistive memory systems and methods of operating the same.

BACKGROUND

Inspired by the computational capability of the human brain, cognitive computing and learning has become an increasingly attractive paradigm for future computation beyond the von Neumann architecture. Along this path toward machine intelligence, machine learning using adaptive dictionaries is the state-of-the-art method of analyzing data. Recent advances in neuro-inspired machine learning algorithms have shown tremendous success in speech/image recognition when run on supercomputers. However, hardware based on sequential von Neumann architecture is inadequate for learning in real-time due given power constraints and the large amounts of data to be analyzed. One proposed solution is the use of resistive cross point arrays. Resistive cross point arrays are utilized to store dictionary weights and to perform matrix vector multiplication operations. While resistive devices in the resistive cross point arrays are provided with multi-level resistive states to represent the dictionary weights, it is difficult to represent large numbers of the dictionary weights with a large resistive cross point array. More specifically, intrinsic process variations in the resistance values of the resistive devices can result in significant loss of precision and therefore unacceptable errors when implementing the learning algorithms. Therefore, more precise techniques of representing dictionary weights with resistive cross point arrays are needed.

SUMMARY

This disclosure relates generally to resistive memory systems. The resistive memory systems may be utilized to implement neuro-inspired learning algorithms. As explained in further detail below, the resistive memory systems can be utilized to perform update operations and matrix multiplication operations with full parallelism. In one embodiment, a resistive memory system includes a cross point resistive network and a plurality of switchable paths. The cross point resistive network includes variable resistive elements and conductive lines. The conductive lines are coupled to the variable resistive elements such that the conductive lines and the variable resistive elements form the cross point resistive network. The plurality of switchable paths are connected to the conductive lines so that the plurality of switchable paths are operable to selectively interconnect groups of the conductive lines such that subsets of the variable resistive elements each provide a combined variable conductance. Thus, each dictionary weight can be represented by the combined variable conductance of one of the subsets. With multiple resistive elements in the subsets, process variations of the resistances (and thus conductances) of the resistive elements tend to average out. In this manner, learning algorithms may be implemented with greater precision using the cross point resistive network.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2 is a table that illustrates different types of matrix operations that may be performed by the resistive memory system with the cross point resistive network.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates to resistive memory systems that include reconfigurable cross point resistive networks. The resistive memory systems can be used to implement learning algorithms where matrix operations may be performed entirely in parallel. More specifically, a cross point resistive network includes variable resistive elements and conductive lines. The conductive lines are coupled to the variable resistive elements such that the conductive lines and the variable resistive elements form the cross point resistive network. Switchable paths are connected to the conductive lines so that subsets of the variable resistive elements can be interconnected so that the subsets of the variable resistive elements provide combined variable conductances. Subsets of the variable resistive elements with multiple variable resistive elements tend to average out process variations and thereby provide conductance levels more consistently.

The resistive memory systems can be utilized to implement learning algorithms that mimic biological neural networks. Stochastic Gradient Descent (SGD) is one of the most efficient algorithms that aims to minimize the reconstruction error $\Sigma_j \|D \cdot Z - x\|^2$, where x is an input vector, D is a matrix called the dictionary, and Z is a coefficient vector, which is usually assumed to be sparse in many problems. To implement the learning algorithm, the matrix values of the matrix D are mapped into the combined variable conductances of the subsets of the variable resistive elements of the cross point resistive network. Learning takes place by updating the matrix values of D and thus by adjusting the combined variable conductances of the subsets of the variable resistive elements. Matrix operations, including updating the matrix values, can take place entirely in parallel as described in further detail below. The matrix D may be considered to have an (m×p) matrix of matrix values, where m and p are both integer numbers.

Figure 1:
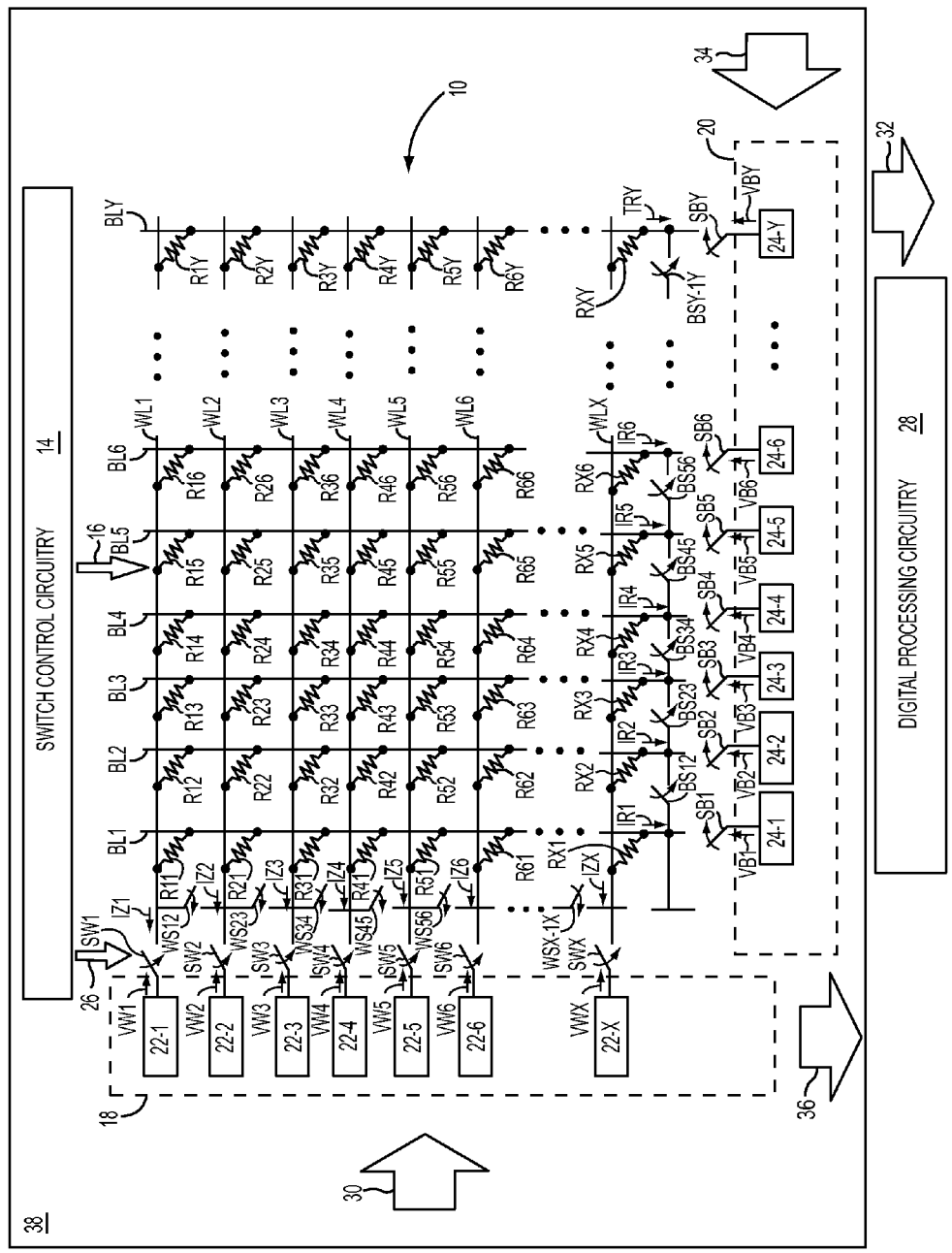
FIG. 1 illustrates an exemplary embodiment of a resistive memory system that includes a cross point resistive network of variable resistive elements and switchable paths that are configured to selectively interconnect word lines and bit lines so that subarrays of the variable resistive elements each provide a combined variable conductance.

FIG. 1 illustrates an exemplary embodiment of a resistive memory system 10 that is configured to implement matrix vector product operations and weight update operations in parallel. The resistive memory system 10 may be configured to perform an artificial intelligence algorithm for machine learning algorithms, such as neuro-inspired machine learning algorithms. The resistive memory system 10 includes a cross point resistive network 12 and switchable paths WS12, WS23, WS34, WS45, WS56, WSX-1X, BS12, BS23, BS34, BS45, BS56, and BSY-1Y (referred to generically as switchable paths W/BS). The cross point resistive network 12 includes variable resistive elements R11, R12, R13, R14, R15, R16, R1Y, R21, R22, R23, R24, R25, R26, R2Y, R31, R32, R33, R34, R35, R36, R3Y, R41, R42, R43, R44, R45, R46, R4Y, R51, R52, R53, R54, R55, R56, R5Y, R61, R62, R63, R64, R65, R66, R6Y, RX1, RX2, RX3, RX4, RX5, RX6, RXY (referred to generically as variable resistive elements R) and conductive lines WL1, WL2, WL3, WL4, WL5, WL6, WLX, BL1, BL2, BL3, BL4, BL5, BL6, BLY (referred to generically as conductive lines W/BL). Each of the variable resistive elements R may be any type of electronic element with a variable resistance that varies between different resistive states. The variable resistive elements may be or may include resistive random access memory (RRAM) elements, conductive bridge random access memory (CBRAM) elements, phase change memory (PCM) elements, spin transfer torque magnetic random access memory (STTMRAM) resistive elements, and/or the like.

The conductive lines W/BL are coupled to the variable resistive elements R such that the conductive lines W/BL and the variable resistive elements R form the cross point resistive network 12. Thus, each of the variable resistive elements R is connected between a corresponding pair of the conductive lines W/BL.

In this embodiment, the conductive lines W/BL are arranged to include word lines WL1, WL2, WL3, WL4, WL5, WL6, WLX (referred to generically as word lines WL) and bit lines BL1, BL2, BL3, BL4, BL5, BL6, BLY (referred to generically as bit lines BL). The word lines WL and the bit lines BL extend in substantially orthogonal directions but, in this embodiment, are not directly connected to one another. Instead, each of the variable resistive elements R is connected between a corresponding one of the word lines WL and a corresponding one of the bit lines BL such that the cross point resistive network 12 is a cross point resistive array. Consequently, the variable resistive elements R shown in FIG. 1 are arranged in the cross point resistive network 12 in rows and columns. There is an integer number Y of variable resistive elements R in each row. Each of the variable resistive elements R in a row is connected to the same word line BL, and each of the variable resistive elements R in a column is connected to the same bit line BL.

More specifically, in the embodiment shown in FIG. 1, the variable resistive elements R11, R12, R13, R14, R15, R16, R1Y, are in a row and are each connected to the word line WL1. The variable resistive elements R21, R22, R23, R24, R25, R26, R2Y, are in a row and are each connected to the word line WL2. The variable resistive elements R31, R32, R33, R34, R35, R36, R3Y, are in a row and are each connected to the word line WL3. The variable resistive elements R41, R42, R43, R44, R45, R46, R4Y, are in a row and are each connected to the word line WL4. The variable resistive elements R51, R52, R53, R54, R55, R56, R5Y, are in a row and are each connected to the word line WL5. The variable resistive elements R61, R62, R63, R64, R65, R66, R6Y, are in a row and are each connected to the word line WL6. The variable resistive elements RX1, RX2, RX3, RX4, RX5, RX6, RXY are in a row and are each connected to the word line WLX.

Furthermore, in the embodiment shown in FIG. 1, the variable resistive elements R11, R21, R31, R41, R51, R61, RX1, are in a column and are each connected to the bit line BL1. The variable resistive elements R12, R22, R32, R42, R52, R62, RX2, are in a column and are each connected to the bit line BL2. The variable resistive elements R13, R23, R33, R43, R53, R63, RX3, are in a column and are each connected to the bit line BL3. The variable resistive elements R14, R24, R34, R44, R54, R64, RX4, are in a column and are each connected to the bit line BL4. The variable resistive elements R15, R25, R35, R45, R55, R65, RX5, are in a column and are each connected to the bit line BL5. The variable resistive elements R16, R26, R36, R46, R56, R66, RX6, are in a column and are each connected to the bit line BL6. The variable resistive elements R1Y, R2Y, R3Y, R4Y, R5Y, R6Y, RXY are in a column and are each connected to the bit line BLY.

It should be noted that the cross point resistive network 12 shown in FIG. 1 is simply exemplary. For example, the cross point resistive network 12 may not be provided as a cross point resistive array but instead in some other suitable alternative physical arrangement. Furthermore, in the embodiment shown in FIG. 1, the integer number of the variable resistive elements R in each row is X, and the integer number of the variable resistive elements R in each in each column is Y may be any number. Additionally, the integer number of the variable resistive elements R in every row is X and the integer number of the variable resistive elements R in every column is Y. However, asymmetric or partially asymmetric alternative arrangements may also be provided where a different integer number of the variable resistive elements R are provided within the different rows and/or a different integer number of the variable resistive elements R are provided within the different columns.

Each of the variable resistive elements R has a variable resistance and thus also a variable conductance. The variable conductances of the variable resistance elements R may be used to represent the matrix values of a matrix. In this embodiment, the variable conductances of the variable resistance elements R are used to represent the matrix values of the matrix D. For example, in one exemplary implementation, all of the switchable paths W/BS are open, and thus the variable conductance of each of the switchable paths W/BS represents a different corresponding matrix value of the matrix D. In exemplary implementation, the integer number m of the matrix D would be equal to X, and the integer number p of the matrix D would be equal to Y. However, the switchable paths W/BS are connected to the conductive lines W/BL so that the plurality of switchable paths W/BS are operable to selectively interconnect one or more groups of the conductive lines W/BL such that one or more sets of the variable resistive elements R provide one or more combined variable conductances. Thus, each set of the variable resistive elements R has a combined variable conductance, which can be used to represent one of the matrix values of the matrix D. Thus, multiple variable resistive elements R can be used to represent a single matrix value of the matrix D. This is advantageous because the combined variable conductance of multiple resistive elements R averages out process variations in the variable conductance of the individual resistive elements R. Thus, by using multiple resistive elements R to represent each matrix value of the matrix D, the impact of resistive element variation can be significantly reduced. However, using multiple resistive elements R to represent each matrix value of the matrix D can have an impact on energy requirements, area requirements, and latency. Accordingly, the switchable paths W/BS are operable to selectively interconnect different combinations of the conductive lines W/BL of the variable resistive elements R so that the sets of variable resistive elements R are reconfigurable as different combinations of the variable resistive elements R. Thus, the switchable paths W/BS allow for optimization of the resistive memory system 10. More specifically, each of the switchable paths W/BS is configured to be opened and closed and is connected between a corresponding pair of the conductive lines W/BL. When one of the switchable paths W/BS is opened, the pair of conductive lines W/BL it is connected to is decoupled, and thus the pair of conductive lines W/BL operates as separate conductive lines W/BL. However, when the switchable conductive paths are closed, the pair of conductive lines W/BL is interconnected, and thus the variable resistive elements R can be grouped to provide the combined variable conductance.

In the embodiment shown in FIG. 1, the switchable paths W/BS include switchable word line interconnection paths WS12, WS23, WS34, WS45, WS56, WSX-1X (referred to generically as switchable word line interconnection paths WS) and switchable bit line interconnection paths BS12, BS23, BS34, BS45, BS56, and BSY-1Y (referred to generically as switchable word line interconnection paths BS). More specifically, the switchable word line interconnection path WS12 is connected between the word line WL1 and the word line WL2. The switchable word line interconnection path WS12 is configured to selectively interconnect the word line WL1 and the word line WL2. As such, when the switchable word line interconnection path WS12 is open, the word line WL1 and the word line WL2 are decoupled. However, when the switchable word line interconnection path WS12 is closed, the word line WL1 and the word line WL2 are interconnected and thus essentially operate as a merged word line.

The switchable word line interconnection path WS23 is connected between the word line WL2 and the word line WL3. The switchable word line interconnection path WS23 is configured to selectively interconnect the word line WL2 and the word line WL3. As such, when the switchable word line interconnection path WS23 is open, the word line WL2 and the word line WL3 are decoupled. However, when the switchable word line interconnection path WS23 is closed, the word line WL2 and the word line WL3 are interconnected and thus essentially operate as a merged word line.

The switchable word line interconnection path WL34 is connected between the word line WL3 and the word line WL4. The switchable word line interconnection path WL34 is configured to selectively interconnect the word line WL3 and the word line WL4. As such, when the switchable word line interconnection path WL34 is open, the word line WL3 and the word line WL4 are decoupled. However, when the switchable word line interconnection path WL34 is closed, the word line WL3 and the word line WL4 are interconnected and thus essentially operate as a merged word line.

The switchable word line interconnection path WS45 is connected between the word line WL4 and the word line WL5. The switchable word line interconnection path WS45 is configured to selectively interconnect the word line WL4 and the word line WL5. As such, when the switchable word line interconnection path WS45 is open, the word line WL4 and the word line WL5 are decoupled. However, when the switchable word line interconnection path WS45 is closed, the word line WL4 and the word line WL5 are interconnected and thus essentially operate as a merged word line.

The switchable word line interconnection path WS56 is connected between the word line WL5 and the word line WL6. The switchable word line interconnection path WS56 is configured to selectively interconnect the word line WL5 and the word line WL6. As such, when the switchable word line interconnection path WS56 is open, the word line WL5 and the word line WL6 are decoupled. However, when the switchable word line interconnection path WS56 is closed, the word line WL5 and the word line WL6 are interconnected and thus essentially operate as a merged word line.

The switchable word line interconnection path WSX-1X is connected between the word line WLX-1 (not explicitly shown in FIG. 1) and the word line WLX. The switchable word line interconnection path WSX-1X is configured to selectively interconnect the word line WLX-1 and the word line WLX. As such, when the switchable word line interconnection path WSX-1X is open, the word line WLX-1 and the word line WLX are decoupled. However, when the switchable word line interconnection path WSX-1X is closed, the word line WLX-1 and the word line WLX are interconnected and thus essentially operate as a merged word line.

The switchable bit line interconnection path BS12 is connected between the bit line BL1 and the bit line BL2. The switchable bit line interconnection path BS12 is configured to selectively interconnect the bit line BL1 and the bit line BL2. As such, when the switchable bit line interconnection path BS12 is open, the bit line BL1 and the bit line BL2 are decoupled. However, when the switchable bit line interconnection path BS12 is closed, the bit line BL1 and the bit line BL2 are interconnected and thus essentially operate as a merged bit line.

The switchable bit line interconnection path BS23 is connected between the bit line BL2 and the bit line BL3. The switchable bit line interconnection path BS23 is configured to selectively interconnect the bit line BL2 and the bit line BL3. As such, when the switchable bit line interconnection path BS23 is open, the bit line BL2 and the bit line BL3 are decoupled. However, when the switchable bit line interconnection path BS23 is closed, the bit line BL2 and the bit line BL3 are interconnected and thus essentially operate as a merged bit line.

The switchable bit line interconnection path BL34 is connected between the bit line BL3 and the bit line BL4. The switchable bit line interconnection path BL34 is configured to selectively interconnect the bit line BL3 and the bit line BL4. As such, when the switchable bit line interconnection path BL34 is open, the bit line BL3 and the bit line BL4 are decoupled. However, when the switchable bit line interconnection path BL34 is closed, the bit line BL3 and the bit line BL4 are interconnected and thus essentially operate as a merged bit line.

The switchable bit line interconnection path BS45 is connected between the bit line BL4 and the bit line BL5. The switchable bit line interconnection path BS45 is configured to selectively interconnect the bit line BL4 and the bit line BL5. As such, when the switchable bit line interconnection path BS45 is open, the bit line BL4 and the bit line BL5 are decoupled. However, when the switchable bit line interconnection path BS45 is closed, the bit line BL4 and the bit line BL5 are interconnected and thus essentially operate as a merged bit line.

The switchable bit line interconnection path BS56 is connected between the bit line BL5 and the bit line BL6. The switchable bit line interconnection path BS56 is configured to selectively interconnect the bit line BL5 and the bit line BL6. As such, when the switchable bit line interconnection path BS56 is open, the bit line BL5 and the bit line BL6 are decoupled. However, when the switchable bit line interconnection path BS56 is closed, the bit line BL5 and the bit line BL6 are interconnected and thus essentially operate as a merged bit line.

The switchable bit line interconnection path BSY-1Y is connected between the bit line BLY-1 (not explicitly shown in FIG. 1) and the bit line BLY. The switchable bit line interconnection path BSY-1Y is configured to selectively interconnect the bit line BLY-1 and the bit line BLY. As such, when the switchable bit line interconnection path BSY-1Y is open, the bit line BLY-1 and the bit line BLY are decoupled. However, when the switchable bit line interconnection path BSY-1Y is closed, the bit line BLY-1 and the bit line BLY are interconnected and thus essentially operate as a merged bit line.

In this manner, each of the word line interconnection paths WS and switchable bit line interconnection paths BS are configured to be opened and closed such that different combinations of subarrays of the variable resistive elements R are selectively interconnected so that each of the subarrays of the variable resistive elements R provides a corresponding combined variable conductance that represents a corresponding matrix value of the matrix D. All of the subarrays thus provide combined variable conductances within the cross point resistive network 12 (i.e., the cross point resistive array in this embodiment), which represent the matrix D. In other words, each subarray represents a different matrix value. The subarrays can be reconfigured in any combination of variable resistive elements R such as 1×1, 1×2, 1×3, 2×1, 2×2, 2×3, 3×1, 3×2, 3×3 subarrays of the variable resistive elements R. Selecting the appropriate implementation of subarrays could be done using scan cells, which allow post-fabrication tuning based on process variation data. This reconfigurability adds a great amount of flexibility that could optimize the number of variable resistive elements R (and thus the area and energy needed to represent a matrix value) in the subarrays versus accuracy requirements for a given application.

The resistive memory system 10 includes switch control circuitry 14 configured to open and close the switchable paths W/BS and thus select a particular combination of the subarrays. In this embodiment, the switch control circuitry 14 is configured to generate a switch control output 16. The switch control output 16 is operable to open and close the switchable paths W/BS. Thus, different permutations of the switch control output 16 may open and close different combinations of the switchable paths W/BS and thus provide different combinations of the variable resistive elements R in the subarrays.

The resistive memory system 10 also includes word line control circuitry 18 and bit line control circuitry 20. The word line control circuitry 18 is configured to generate a word line output, which in this embodiment may be provided as different combinations of word line voltages VW1, VW2, VW3, VW4, VW5, VW6, VWX (referred to generically as word line voltages VW), as explained in further detail below. The bit line control circuitry 20 is configured to generate a bit line output, which in this embodiment may be provided as different combinations of bit line voltages VB1, VB2, VB3, VB4, VB5, VB6, VBY (referred to generically as bit line voltages VB). The word line control circuitry 18 is configured to generate the word line output onto the word lines WL, and the bit line control circuitry is configured to generate the bit line output onto the bit lines BL such that different types of matrix operations can be performed in parallel. For example, the word line output can be generated to represent a vector to perform matrix multiplication in parallel. Similarly, the bit line output can be generated to represent a vector to perform matrix multiplication in parallel. Furthermore, the word line control circuitry 18 is configured to generate the word line output onto the word lines WL, and the bit line control circuitry 20 is configured to generate a bit line output onto the bit lines BL such that each of the combined variable conductances provided by the subarrays is adjustable in parallel.

The word line control circuitry 18 includes an integer number X of word line controllers (referred to generically as word line controllers 22 and specifically as word line controllers 22-1 through 22-X). Each of the word line controllers 22 is configured to generate a corresponding one of the word line voltages VW onto a corresponding one of the word lines WL, as shown in FIG. 1. With respect to the bit line control circuitry, the bit line control circuitry 20 includes an integer number Y of bit line controllers (referred to generically as bit line controllers 24 and specifically as bit line controllers 24-1 through 22-Y). Each of the bit line controllers 24 is configured to generate a corresponding one of the bit line voltages VB onto a corresponding one of the bit lines BL, as shown in FIG. 1. However, the integer number m and the integer number p of the matrix D represented by the cross point resistive network 12 are reconfigurable based on the integer number of rows and the integer number of columns provided in the subarrays.

For example, if all of the switchable paths W/BS are opened, then 1×1 subarrays are selected. As such, the variable conductance of every one of the variable resistive elements R will represent a different matrix value of the matrix D. Thus, the integer number m will equal the integer number X, and the integer number p will equal the integer number Y. Thus, to perform the different matrix operations, the word line output includes each of the word line voltages VW1, VW2, VW3, VW4, VW5, VW6, VWX (referred to generically as word line voltages VW), and the bit line output includes all of the bit line voltages VB1, VB2, VB3, VB4, VB5, VB6, VBY.

However, if at least some of the switchable paths W/BS are closed so that the subarrays include blocks of the variable resistive elements R with multiple resistive elements R, then the integer number m and the integer number p will depend on the size of the subarrays. For example, a pattern of three adjacent word line switches WS and three adjacent bit line switches BS can be selected. In accordance with the pattern, the first and the second word line switches WS are closed, and the third word line switch WS is open. Furthermore, the first and the second bit line switches BS are closed, and the third bit line switch BS is open. Accordingly, 3×3 sized subarrays would be selected. To illustrate, when following the above mentioned pattern, the word line switches WS12, WS23 would be closed, and the word line switch WS34 would be opened. Similarly, the bit line switches BS12, BS23 would be closed, and the word line switch BS34 would be opened. Accordingly, the word lines WL1, WL2 would be interconnected while the word line WL3 is decoupled from the word lines WL1, WL2, and the bit lines BL1, BL2 would be interconnected while the bit line BL3 would be decoupled from the bit lines BL1, BL2.

For example, the variable resistive elements R11, R12, R13, R21, R22, R23, R31, R32, R33 are provided as one of the 3×3 subarrays such that the variable resistive elements R11, R12, R13, R21, R22, R23, R31, R32, R33 provide a combined variable conductance. The combined variable conductance of the variable resistive elements R11, R12, R13, R21, R22, R23, R31, R32, R33 represents a corresponding matrix value of the matrix D. By following this pattern for all of the switchable paths W/BS, rows and columns of 3×3 subarrays are provided so that the combined variable conductances of the 3×3 subarrays represent the matrix values of the matrix D. When 3×3 subarrays are provided, then the integer value m of the matrix D is equal to the integer value Y divided by three, and the integer value p of the matrix D is equal to the integer value X divided by three.

Different patterns of the words lines WL and the bit lines BL may be opened and closed so that different sized subarrays are provided to create combined variable conductances that represent the matrix values of the matrix D when the integer number m and the integer number p are changed. However, the matrix operations are be performed where the word line output will represent vectors having a number of vector values that match the integer number p, and the bit line output will represent vectors having a number of vector values that match the integer m. As such, the word line output will include a proper subset of the word line voltages VW1, VW2, VW3, VW4, VW5, VW6, VWX (referred to generically as word line voltages VW), and the bit line output will include a proper subset of the bit line voltages VB1, VB2, VB3, VB4, VB5, VB6, VBY in accordance with the size of the subarrays.

For instance, when 3×3 subarrays are provided, then the word line control circuitry 18 provides the word line output with one of the word line voltages VW for every three interconnected word lines WL, and the bit line control circuitry 20 provides the bit line output with one of the bit line voltages VB for every three interconnected bit lines BL. In one example, the word line control circuitry 18 provides the word line output with the bit line voltage VW1, VW4, VWX-2 (not explicitly shown), and the word line control circuitry 18 provides the bit line output with the bit line voltage VB1, VB4, VBY-2 (not explicitly shown) when 3×3 subarrays are provided.

To do this, the resistive memory system 10 includes word line switches (referred to generically as word line switches SW and specifically as word line switches SW1-SWX) connected between a corresponding one of the word line controllers 22 and a corresponding one of the word lines WL and bit line switches (referred to generically as bit line switches BW and specifically as word line switches BW1-BWY) connected between a corresponding one of the bit line controllers 24 and a corresponding one of the bit lines BL. More specifically, the word line switch SW1 is connected between the word line controllers 22-1 and the word line WL1. The word line switch SW2 is connected between the word line controllers 22-2 and the word line WL2. The word line switch SW3 is connected between the word line controllers 22-3 and the word line WL3. The word line switch SW4 is connected between the word line controllers 22-4 and the word line WL4. The word line switch SW5 is connected between the word line controllers 22-5 and the word line WL5. The word line switch SW6 is connected between the word line controllers 22-6 and the word line WL6. The word line switch SWX is connected between the word line controllers 22-X and the word line WL.

With respect to the bit line control circuitry 20, the bit line switch SB1 is connected between the bit line controller 24-1 and the bit line BL1. The bit line switch SB2 is connected between the bit line controller 24-2 and the bit line BL2. The bit line switch SB3 is connected between the bit line controller 24-3 and the bit line BL3. The bit line switch SB4 is connected between the bit line controller 24-4 and the bit line BL4. The bit line switch SB5 is connected between the bit line controller 24-5 and the bit line BL5. The bit line switch SB6 is connected between the bit line controller 24-6 and the bit line BL6. The bit line switch SBY is connected between the bit line controller 24-Y and the bit line BLY.

Each of the word line switches SW and each of the bit line switches SB is configured to be opened and closed. In this manner, the switch control circuitry 14 is configured to generate a switch control output 26 that is configured to open and close the word line switches SW and the bit line switches SB based on the size of the subarrays selected by the switch control output 16. As such, the word line controllers 22 are interconnected by the word line switches SW to the word lines WL so that one of the word line controllers 22 is provided per row of subarrays while the remainder of the word line controllers 22 per row of subarrays are decoupled by the word line switches SW. The bit line controllers 24 are interconnected by the bit line switches SB to the bit lines BL so that one of the bit line controllers 24 is provided per column of subarrays while the remainder of the bit line controllers 24 per column of subarrays are decoupled by the bit line switches SB.

Referring now to FIG. 1 and FIG. 2, FIG. 2 illustrates different types of matrix operations that may be performed by the resistive memory system 10. As explained above, the matrix values of the matrix D are mapped onto the subarrays of the cross point resistive network 12. Each of the word line controllers 22 and each of the bit line controllers 24 have write circuitry and read circuitry in order to perform the operations shown in FIG. 2. The matrix values of the matrix D are represented by G, which are the combined variable conductances of the subarrays. The D·Z operation and the $D^T \cdot r$ operation are read type operations (described in FIG. 2) and are thus performed by inputting the word line output or the bit line output as small voltage pulses and outputting line currents on the bit lines BL or the word line WL, as explained in further detail below. These read operations take place fully in parallel, and thus matrix multiplication operations take place in parallel, thereby providing resultant vectors with increased speed.

Learning takes place through the D update operation. Since the matrix values of D are represented by the corresponding combined variable conductances G of a corresponding one of the subarrays, the D update operation is performed by adjusting the combined variable conductances G of the subarrays. The D update operation is a write type operation that is performed by inputting the word line output and the bit line output as large appropriately timed voltage pulses, as explained in further detail below. In this manner, the combined variable conductances of all the subarrays in the entire cross point resistive network are updated in parallel.

Referring again to FIGS. 1 and 2, the D·Z operation is performed utilizing write circuits in the word line controllers 22 of the word line control circuitry 18 and read circuits in the bit line controllers 24 of the bit line control circuitry 20. As explained in further detail below, the D·Z operation is a matrix multiplication operation performed by applying the world line voltages VW representing the vector Z on the word lines WL, and obtaining bit line currents (referred to generically as IR and specifically as IR1-IRY) representing resultant vector D·Z from the bit lines BL. As shown in FIG. 1, the resistive memory system 10 is operably associated with digital processing circuitry 28. The digital processing circuitry 28 is configured to generate a digital vector output 30 that includes digital vector values of the vector Z. Each of the write circuits in each of the word line controllers 22 is configured to convert a corresponding one of the digital vector values into its corresponding word line voltage VW such that the word line voltage VW represents the corresponding one of the digital vector values. In this case, the word line controllers 22 set the word line voltages VW to a voltage magnitude that is proportional to the corresponding digital vector value. For each of the word line voltages VW, the word line voltage VW multiplied by the combined variable conductance $G_{ij}$ represents weight times vector value multiplication. Summation takes place since the resultant vector value for a column of subarrays is the result of all of the combined variable conductances of the corresponding column of subarrays.

As mentioned above, the number of subarrays in a column of subarrays varies depending on how many columns of the variable resistive elements R are provided in each of the subarrays. Thus, a number of digital vector values of the vector Z will match the number of subarrays in a column of subarrays. Thus, only one word line controller 22 per row of the subarrays provides its corresponding word line voltage VW onto the corresponding word line WL (i.e., one per row subarrays). In this manner, the number of the word line voltages VW matches the number of subarrays in a column of subarrays. The switch control circuitry 14 generates a permutation of the switch control output 26 so that each row of the subarrays receives one of the word line voltages VW, while the other word line controllers 22 corresponding to the other word lines WL in the row of the subarrays are decoupled. Thus, different rows of the subarrays receive a different one of the word line voltages VW, and a combination of the word line voltages VW is provided to match the number of subarrays for the columns of the subarrays.

Referring again to FIG. 1 and FIG. 2, a combination of bit line currents IR are generated by each column of subarrays. The combination of bit line currents IR represents the resultant vector of D·Z. Matrix multiplication is achieved in parallel since each of the bit line currents IR in the combination of bit line currents IR represents a different vector value of the resultant vector approximately equal to:

$$IRS(i) = \Sigma G_{ij} \cdot VWS(j)$$

The function S(j) converts a subarray column position j to a word line position within the subarray and converts a row position i of the subarrays to a bit line position. For example, if 1×1 subarrays are selected, then the word line positions exactly match the column positions of the 1×1 subarrays and the row position of the subarrays matches the bit line positions of the subarrays. Thus, S(i)=i and S(j)=j. Accordingly, the word line controllers 22 will each generate a corresponding word line voltage VW so that all of the word line voltages VW1-VWX are applied to the word lines WL1-WLX. Furthermore, all of the bit line currents IR1-IRY will be provided in response to the word line voltages VW1-VWX. Each of the line currents IR is approximately equal to the weighted sum of each word line voltage VW multiplied by the variable conductance of each of the resistive elements R (since the array is a 1×1 array) in different corresponding column of the resistive elements R. Each of the bit line controllers 24 includes a read circuit. In this case, each of the bit line controllers 24 of the bit line control circuitry 20 is configured to receive a corresponding one of the bit line currents IR1-IRY from its corresponding bit line BL. The read circuit in each of the bit line controllers 24 is configured to convert its corresponding bit line current IR1-IRY to a digital resultant vector value. The resultant vector values from the bit line controllers 24 are combined so that the bit line control circuitry 20 generates a resultant digital vector output 32. The resultant digital vector output 32 is received by the digital processing circuitry 28 to continue implementing the learning algorithm.

However, if multiple word lines WL and/or multiple bit lines are merged, subarrays with multiple numbers of the resistive elements will be provided, and a combination of the bit line currents IR is generated in response to a combination of the word line voltages VW. For example, if 3×3 subarrays are selected, then the word line positions do not match the column positions of the 3×3 subarrays and the row position of the subarrays do not match the bit line positions of the subarrays. Instead, S(i)=i+(i−1)*2 and S(j)=j+(j−1)*2. Thus, the 1 subarray column position maps to the 1 word line position; the 2 subarray column position maps to the 4 word line position; etc. Similarly, the 1 subarray row position maps to the 1 bit line position; the 2 subarray row position maps to the 4 bit line position; etc. Accordingly, only the word line controllers 22 corresponding to the word line positions will each generate their corresponding word line voltage VW, and only these the word line voltages VW1, VW4, . . . VW-2 (not shown in FIG. 1) are applied to the word lines WL1, WL4, . . . WL-2 (not shown in FIG. 1). Furthermore, only the bit line currents IR1, IR4, IRY-2 (not shown in FIG. 1) will be provided in response to the word line voltages VW1, VW4, . . . VW-2. Each of the line currents IR is approximately equal to the weighted sum of each word line voltage VW multiplied by the combined variable conductance of each of the 3×3 subarrays in different corresponding column of 3×3 subarrays. The bit line controllers 24-1, 24-4, 24X-2 (not shown in FIG. 1) are each configured to receive one of the bit line currents IR1, IR4, IRY-2 from the corresponding bit line BL. The read circuit in each of the bit line controllers 24-1, 24-4, 24Y-2 is configured to convert its corresponding bit line current IR1, IR4, IRY-2 to a digital resultant vector value. The resultant vector values from the bit line controllers 24-1, 24-4, 24Y-2 are combined so that the bit line control circuitry 20 generates the resultant digital vector output 32. The resultant digital vector output 32 is received by the digital processing circuitry 28 to continue implementing the learning algorithm.

Referring again to FIGS. 1 and 2, the $D^T \cdot r$ operation is performed utilizing write circuits in the bit line controllers 24 of the bit line control circuitry 20 and read circuits in the word line controllers 22 of the word line control circuitry 18. The $D^T \cdot r$ operation is a matrix multiplication operation performed by applying the bit line voltages VB representing the vector r on the bit lines BL and obtaining word line currents (referred to generically as IZ and specifically as IZ1-IZX) representing resultant vector $D^T \cdot r$ from the word lines WL. The digital processing circuitry 28 is configured to generate a digital vector output 34 that includes digital vector values of the vector r. Each of the write circuits in each of the bit line controllers 24 is configured to convert a corresponding one of the digital vector values into its corresponding bit line voltage VB such that the bit line voltage VB represents the corresponding one of the digital vector values. In this case, the bit line controllers 24 are configured to set each of the voltage magnitudes of each of the bit line voltages VB in accordance with its corresponding digital vector value.

As mentioned above, however, the number of subarrays in a row of subarrays varies depending on how many rows of the variable resistive elements R are provided in each of the subarrays. Thus, a number of digital vector values of the vector r will match the number of subarrays in a row of subarrays. Thus, only one bit line controller 24 per column of the subarrays provides its corresponding bit line voltage VB onto the corresponding bit line BL. Thus, the number of the bit line voltages VB matches the number of subarrays in a row of subarrays. The switch control circuitry 14 generates a permutation of the switch control output 26 so that each column of the subarrays receives one of the bit line voltages VB, while the other bit line controllers 24 corresponding to the other bit lines BL in the column of the subarrays are decoupled. Thus, different columns of the subarrays receive a different one of the bit line voltages VB, and a combination of the bit line voltages VB is provided to match the number of subarrays in a row of the subarrays.

Referring again to FIG. 1 and FIG. 2, a combination of word line currents IZ is generated by each row of subarrays. The combination of word line currents represents the resultant vector of $D^T \cdot r$. Matrix multiplication is achieved in parallel since each of the word line currents IZ1 represents a vector value of the resultant vector equal to $$IZS(j) = \Sigma G_{ij} \cdot VBS(i)$$

If 1×1 subarrays are selected, then the bit line positions exactly match the row positions of the 1×1 subarrays and the column position of the subarrays matches the word line positions of the subarrays. Thus, S(i)=i and S(j)=j. Accordingly, all the bit line controllers 24 will each generate their corresponding bit line voltage VB so that all of the bit line voltages VB1-VBY are applied to the bit lines BL1-BLY. Furthermore, all of the word line currents IZ1-IZX will be provided in response to the bit line voltages VB1-VBY. Each of the line currents IZ is approximately equal to the weighted sum of each bit line voltage VB multiplied by the variable conductance of each of the resistive elements R (since the array is a 1×1 array) in different corresponding row of the resistive elements R. Each of the word line controllers 22 includes a read circuit. In this case, each of the word line controllers 22 of the word line control circuitry 18 is configured to receive one of the word line currents IZ1-IZX from its corresponding word line WL. The read circuit in each of the word line controllers 22 is configured to convert its corresponding word line current to a digital resultant vector value. The resultant vector values from the word line controllers 22 are combined so that the word line control circuitry 18 generates a resultant digital vector output 36. The resultant digital vector output 36 is received by the digital processing circuitry 28 to continue implementing the learning algorithm.

However, if multiple bit lines BL and/or multiple word lines are merged, subarrays with multiple numbers of the resistive elements will be provided and generated in response to the bit line voltages, wherein each of the word line currents is generated by a different row of the subarrays. For example, if 3×3 subarrays are selected, then the bit line positions do not match the row positions of the 3×3 subarrays and the column position of the subarrays does not match the word line positions of the subarrays. Instead, S(i)=i+(i−1)*2 and S(j)=j+j−1)*2. Thus, the 1 subarray row position maps to the 1 bit line position; the 2 subarray row position maps to the 4 bit line position; etc. Similarly, the 1 subarray column position maps to the 1 word line position; the 2 subarray column position maps to the 4 word line position; etc. Accordingly, only the bit line controllers 24 corresponding to the bit line positions will each generate their corresponding bit line voltage VB and only these the bit line voltages VB1, VB4, . . . VBY-2 (not shown in FIG. 1) are applied to the bit lines BL1, WL4, . . . VBY-2 (not shown in FIG. 1). Furthermore, only the word line currents (IZ1, IZ4, IZX-2) will be provided in response to the bit line voltages VB1, VB4, . . . VBY-2. Each of the line currents IZ is approximately equal to the weighted sum of each bit line voltage VB multiplied by the combined variable conductance of each of the 3×3 subarrays in different corresponding row of 3×3 subarrays. The word line controllers 22-1, 24-4, 24X-2 (not shown in FIG. 1) are each configured to receive one of the word line currents IZ1, IZ4, IZX-2 from the corresponding word line WL. The read circuit in each of the word line controllers 22-1, 24-4, 22-1, 24-4, 24X-2 is configured to convert its corresponding word line current IZ1, IZ4, IZX-2 to a digital resultant vector value. The resultant vector values from the word line controllers 22-1, 24-4, 22-1, 24-4, 24X-2 are combined so that the word line control circuitry 18 generates the resultant digital vector output 36 to represent the resultant vector with the digital vector values. The resultant digital vector output 36 is received by the digital processing circuitry 28 to continue implementing the learning algorithm.

Referring again to FIGS. 1 and 2, the update D operation is performed utilizing write circuits in the word line controllers 22 of the word line control circuitry 18 and write circuits in the bit line controllers 24 of the bit line control circuitry 20. Each of the matrix values of the matrix D may have a value range of discrete values. For example, in one embodiment, each of the matrix values of the matrix D may be provided as any one of sixty four different values. The change in the matrix D is equal to $\Delta D = \eta \cdot r \cdot Z$. The value $\eta$ is the learning rate. The change in the matrix D is thus proportional to the matrix multiplication of the resultant vector $r \cdot Z$.

Accordingly, the subarrays of resistive elements R are each configured to vary their respective combined variable conductance to discrete variable conductance levels that map to the discrete values within the value range. In this manner, the combined variable conductances of the subarrays of resistive elements can represent the matrix values of the D matrix. The change for each combined variable conductance can thus be represented by changing each of the combined variable conductances to equal approximately:

$$\Delta G_{ij} = \eta \cdot r_i \cdot Z_j$$

In this embodiment, the digital processing circuitry 28 does not calculate $Z \cdot r$ before programming. Instead, the word line control circuitry 18 is configured to generate the word line output onto the word lines WL and the bit line control circuitry 20 is configured to generate the bit line output onto the bit lines BL such that each of the plurality of combined variable conductances G provided by the subarrays is adjustable in parallel. To do this, the digital processing circuitry 28 is configured to generate the digital vector output 30 to represent the digital vector values of the vector r and to generate the digital vector output 34 to represent the digital vector value of the vector Z. The word line control circuitry 18 is configured to receive the digital vector output 30, and the bit line control circuitry 20 is configured to receive the resultant digital vector output 32. A combination of the word line controllers 22 generates a combination of the word line voltage VW, and a combination of the bit line controllers 24 will generate the bit line voltages VB. The combination of the word line controllers 22, the word line voltage VW, the bit line controllers 24, and bit line voltages will depend on the size of the subarrays selected to provide combined variable conductances, as explained above with regard to the D·Z operation and the $D^T \cdot r$ operation.

However, during the update D operation, the word line voltages VW and the bit line voltages VB are generated at the same time. The matrix values of the vector $Z_j$ are always positive numbers, while the vector values $r_i$ of the vector r can be positive or negative, depending on the residual error. Therefore whether the matrix value of the matrix D and the corresponding combined variable conductance $G_{ij}$ that represents the matrix value will increase or decrease depends on the sign of the corresponding the vector value $r_i$, but not the vector value $Z_j$. When vector value $r_i$ is positive, the matrix value and thus the combined variable conductance $G_{ij}$ decreases, but when the vector value $r_i$ is positive, the matrix value and thus the combined variable conductance $G_{ij}$ increases.

Since the vector value $r_i$ can be both positive and negative, the word line controllers 22 have to generate the corresponding word line voltage VW so that the combined variable conductance $G_{ij}$ of the subarray of variable resistive elements R can be both decreased and increased. In the presently disclosed synchronous design, each write period is divided into a positive write phase that deals with the condition of the vector value $r_i > 0$ phases and the negative write phase deals with the condition of vector value $r_i < 0$ (negative period). The synchronizing of the write periods may be synchronized by a clock signal. The word line control circuitry 18 is configured to generate the word line write output as a combination of the word line voltages VW each representing a the vector value $Z_j$ of the vector Z by providing each of the word line voltages VW in the combination of the word line voltages VW with a negative pulse and a positive pulse with pulse durations set in accordance to a corresponding vector value of the vector value $Z_j$ of the vector Z. More specifically, during the positive phase, each of the word line controllers 22 generates one of the word line voltages VW in the combination of the word line voltages VW during the positive phase as the negative pulse where a pulse duration of the negative pulse is set in accordance with the corresponding vector value $Z_j$ of the vector Z. Furthermore, each of the word line controllers 22 generates one of the word line voltages VW in the combination of the word line voltages VW during the negative phase as the positive pulse where a pulse duration of the positive pulse is set in accordance with the corresponding vector value $Z_j$ of the vector Z. Each row of the subarrays receives the corresponding word line voltage VW representing a different corresponding vector value of the vector Z.

With regard to the vector r, the bit line control circuitry 20 is configured to generate the combination of the bit line voltages VB representing the vector r by providing each of the bit lines voltages VB in the combination of the bit line voltages VB with a set of pulses such that, for each of the each of the bit lines voltages VB in the combination of the bit line voltages VB, the number of the set of pulses is set in accordance to a corresponding vector value $r_i$ of the r. More specifically, the bit line controllers 24 of the bit line control circuitry 20 are configured such that for each of the bit lines voltages VB in the combination of the bit line voltages VB, the set of pulses is a set of positive pulses that at least partially temporally align with the negative pulse of a corresponding one of the word line voltages VW representing the vector value $Z_j$, where the number of positive pulses in the set of positive pulses is set in accordance with a magnitude of the corresponding vector value $r_i$. Furthermore, the bit line controllers 24 of the bit line control circuitry 20 are configured such that for each of the bit lines voltages VB in the combination of the bit line voltages VB, the set of pulses is a set of negative pulses that at least partially temporally align with the positive pulse of a corresponding one of the word line voltages VW representing the vector value $Z_j$, where the number of positive pulses in the set of negative pulses is set in accordance with a magnitude of the corresponding vector value $r_i$.

In this manner, if the vector value $r_i$ is greater than zero for a particular subarray, the combined variable conductance $G_{ij}$ of the corresponding subarray of variable resistive elements R decreases in accordance with an amount of temporal overlap between the negative pulse of the corresponding word line voltages VW representing the vector value $Z_j$ and the set of positive pulses of the bit line voltage VB representing the vector value $r_i$. If the vector value $r_i$ is less than zero for a particular subarray, the combined variable conductance $G_{ij}$ of the corresponding subarray of variable resistive elements R increases in accordance with an amount of temporal overlap between the positive pulse of the corresponding word line voltages VW representing the vector value $Z_j$ and the set of negative pulses of the bit line voltage VB representing the vector value $r_i$. Thus, in such a synchronous design, the accumulated overlap time is proportional to the product of $Z_j \cdot r_i$. Accordingly, by providing the combination of world line voltages VW that represent the vector values $Z_j$ of the vector Z and the combination of bit line voltages VB that represent the vector values $r_i$ of the vector r during a write cycle, the combined variable conductance $G_{ij}$ of all the subarrays of the resistive elements throughout the entire cross point resistive network 12 may be updated in parallel.

In exemplary implementation of the resistive memory system 10, all of the variable resistive elements R are each provided as an RRAM element. The cross point resistive network 12, the word lines WL, the bit lines BL, the switchable paths W/BS, the switch control circuitry 14, the word line control circuitry 18, and the bit line control circuitry 20 are all formed on a semiconductor die 38. In one embodiment, the switchable paths W/BS, the switch control circuitry 14, the word line control circuitry 18, and the bit line control circuitry 20 are formed in a semiconductor substrate of the semiconductor die 38, which may be provided in accordance with 65 nm CMOS technology. The variable resistive elements R, the word lines WL, and the bit lines BL may be formed within the BEOL of the semiconductor die 38. Also, in one exemplary embodiment, the digital processing circuitry 28 is provided as an Intel i7 8-core processor, memory, and a digital interface. The memory stores software run by the Intel i7 8-core processor to coordinate the implementation of the learning algorithm along with digital representations of the Z vector, r vector, and x vector. The digital interface operably associates the digital processing circuitry 28 with the switch control circuitry 14, the word line control circuitry 18, and the bit line control circuitry 20 so that switch commands, the digital vector output 30, the resultant digital vector output 32, the digital vector output 34 and the resultant digital vector output 36 can be transmitted to and from the digital processing circuitry 28.

Figure 3:
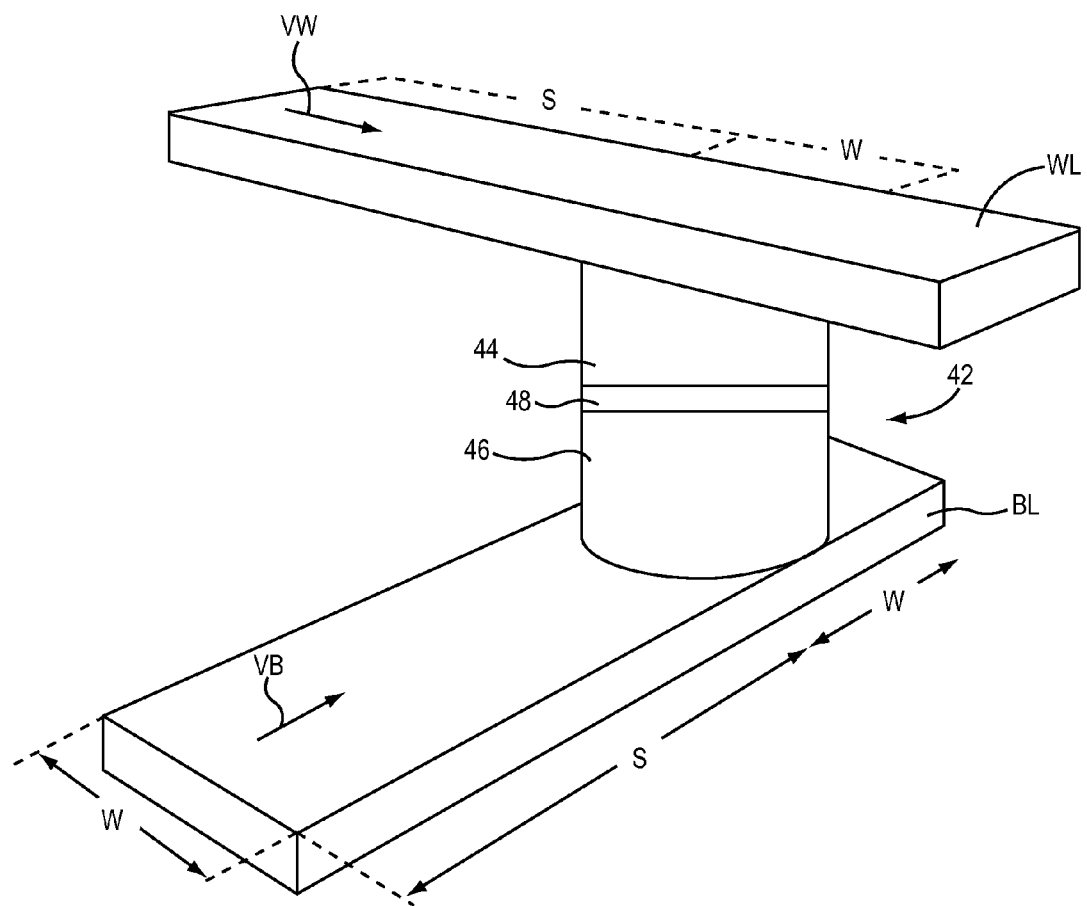
FIG. 3 illustrates an exemplary embodiment of a resistive random access memory (RRAM) element, which may be provided as a variable resistive element in the cross point resistive network shown in FIG. 1.

FIG. 3 illustrates an exemplary embodiment of an RRAM element 42. In one example, each of the variable resistive elements R of the cross point resistive network 12 shown in FIG. 1 is provided in the same manner as the RRAM element 42 shown in FIG. 3. The RRAM element 42 includes a first electrode 44, a second electrode 46, and an insulating layer 48 provided between the first electrode 44 and the second electrode 46. The first electrode 44 and the second electrode 46 may be provided from any material suitable to provide RRAM elements. The insulating layer 48 may be formed from an oxide material or any other type of suitable insulating material.

The RRAM element 42 has a variable conductance that is adjustable by applying a voltage pulse across the RRAM element. The change in the variable conductance depends on a temporal length of the voltage pulse. As shown, the RRAM element 42 is connected between the word line WL and the bit line BL. In this manner, the corresponding word line voltages VW representing the vector value $Z_j$ and the bit line voltage VB representing the vector value $r_i$ can adjust the variable conductance of the RRAM element 42, as explained above. Since subarrays of the variable resistive elements R may be interconnected to provide the combined variable resistance representing one of the matrix values of D, the read inaccuracy can be high with small wire widths (e.g., W=20 nm), due to voltage drop on interconnects. Accordingly, wire widths W may be selected to be approximately 200 nm. The effect of the element spacing (S) on the read accuracy tends to be less prominent. Larger wire width W and smaller element spacing S (or wire pitch) reduce RC delay. However, the current overshoot due to element capacitance can be high when element spacing S is small. Therefore, in one embodiment, the element spacing S is provided to be approximately 1 μm.

Figure 4:
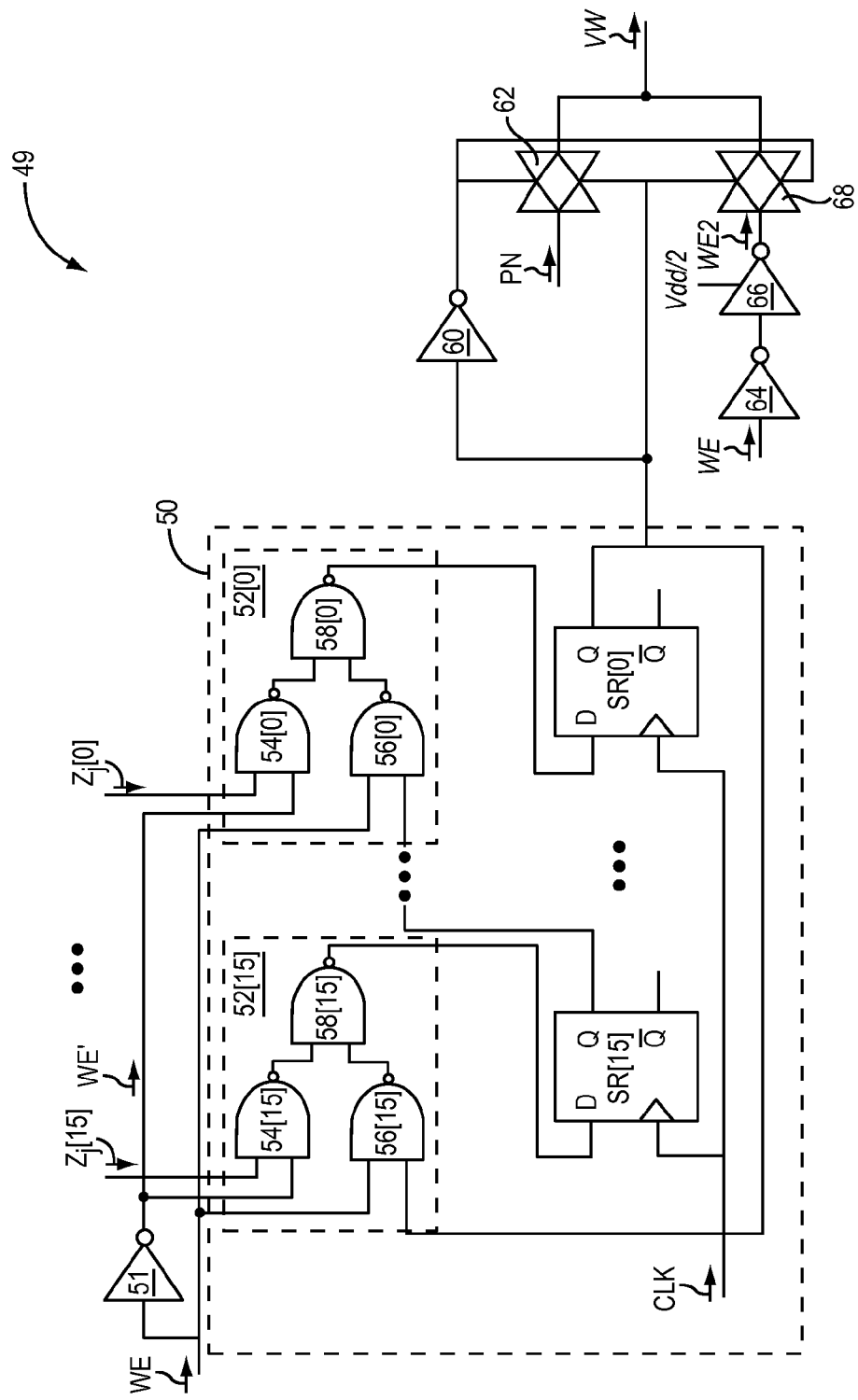
FIG. 4 illustrates one embodiment of a write circuit that may be provided in each of the word line drivers shown in FIG. 1 so as to generate a word line voltage with a positive pulse and a negative pulse having pulse durations set in accordance with a digital vector value $Z_j$.

FIG. 4 illustrates one embodiment of a write circuit 49 that may be provided in each of the word line controllers 22 shown in FIG. 1 in order to generate the word line voltage VW that provides a negative pulse and a positive pulse each having pulse durations set in accordance to the corresponding digital vector value $Z_j$. The write circuit 49 is configured to receive a write enable signal WE, the digital vector value $Z_j$, a write phase indication signal PN, and a clock signal. In this embodiment, the write enable signal WE is provided in a high voltage state to indicate a write period and in a low voltage state to indicate a state between write periods. The digital vector value $Z_j$ is provided as sixteen bit signals $Z_j[15]$-$Z_j[0]$ where each of the bit signals $Z_j[15]$-$Z_j[0]$ represents a different bit that makes up the digital vector value $Z_j$. In this embodiment, the digital vector value $Z_j$ is provided so that a number of the bit signals $Z_j[15]$-$Z_j[0]$ representing a logical "1" indicates the digital vector value $Z_j$, and the bit signals representing a logical "1" are all provided to the right. The write phase indication signal PN indicates the positive phase of the write period in a low voltage state and the negative phase of the write period in a high voltage state. The clock signal CLK is a standard synchronous clock signal. For each write period there are 32 clock cycles of the clock signal CLK. An inverter 51 is configured to generate an inverted write enable signal WE'.

The write circuit 49 includes a 16 bit-shift register 50 that includes multiplexers 52[15]-52[0] (referred to generically as multiplexers 52) and the flip flops SR[15]-SR[0] (referred to generically as flip flops SR). The multiplexers 52 each include an NAND gate 54 (referred to specifically as NAND gates 54[15]-54[1]) and NAND gate 56 (referred to specifically as NAND gates 56[15]-56[1]) and an NAND gate 58 (referred to specifically as NAND gates 58[15]-58[1]). Each of the NAND gates 54 has an input terminal that receives a corresponding one of the bit signals $Z_j[15]$-$Z_j[0]$ and an input terminal that receives the inverted write signal WE'. The output terminal of each of the NAND gates 54 is connected to one of the input terminals of the NAND gate 58. Each of the NAND gates 56 has an input terminal that receives the write enable signal WE and an output terminal connected to the other input terminal of the NAND gate 58. The output terminal of the NAND gates 58 are connected to the data terminal D of a corresponding one of the flip flops SR. For every NAND gate 56 other than the NAND gate 56[15], the other input terminal is connected to the output terminal Q of the previous one of the flip flops SR. With regard to the NAND gate 56[15], the other input terminal of the NAND gate 56[15] is connected to the output terminal Q of the flip flop SR[0]. Each of the flip flops SR receives the clock signal CLK at a corresponding clock gate.

Thus, while the write enable signal WE is between write periods, the multiplexers 52 provide the corresponding one of the bit signals $Z_j[15]$-$Z_j[0]$ to the flip flop SR so that the corresponding one of the bit signals $Z_j[15]$-$Z_j[0]$ is stored. However, when the write enable signal WE indicates a write period, the multiplexers 52 provide the bit values from the output terminal Q of the previous flip flop SR, except for the multiplexer 52 [15], which provides the bit value from the output terminal Q of the flip flop SR[0]. As such, during the write period, the bit signals $Z_j[15]$-$Z_j[0]$ are shifted right but recycled due to the loop back from the flip flop SR[0] to the multiplexer 52[15]. With 32 clock cycles for one write period, the shift register generates two identical pulses with the duty cycle proportional to the value of $Z_j$. The output terminal Q of the flip flop SR[0] is coupled to an inverter 60. The write phase indication signal PN is received by a sampling gate 62 that is clocked by the output terminal of the flip flop SR[0] and by the inverter 60. The write enable signal WE is received by an inverter 64 that is coupled to an inverter 66. The inverter 66 is supplied by a voltage Vdd/2 which is at intermediary voltage state. Thus, the inverter 66 generates a write enable signal WE2 that is in the low voltage state when the write enable signal WE is in the low voltage state but is in the intermediary voltage state when the write enable signal WE is in the high voltage state. The write enable signal WE2 is received by a sampling gate 68 clocked in an opposite manner with respect to the output terminal Q of the flip flop SR[0] and the inverter 60. The outputs from the sampling gate 62 and the sampling gate 68 are combined to provide the word line voltage VW.

In this manner, during the positive phase of the write period, the word line voltage is in the low voltage state (i.e., the negative pulse) for a certain time proportional to the digital value $Z_j$ and then switches to the intermediary voltage state. During the negative phase of the write period, the word line voltage is in the high voltage state (i.e., the positive pulse) for a certain time proportional to the digital value $Z_j$ and then switches to the intermediary voltage state. The 16-bit shift register 50 converts the digital value $Z_j$ into a sequential output at the output terminal Q of the flip flop SR[0]. The temporal duration of the positive pulse and of the negative pulse is proportional to the number of the bit signals $Z_j[15]$-$Z_j[0]$ provides as a logical "1".

Figure 5:
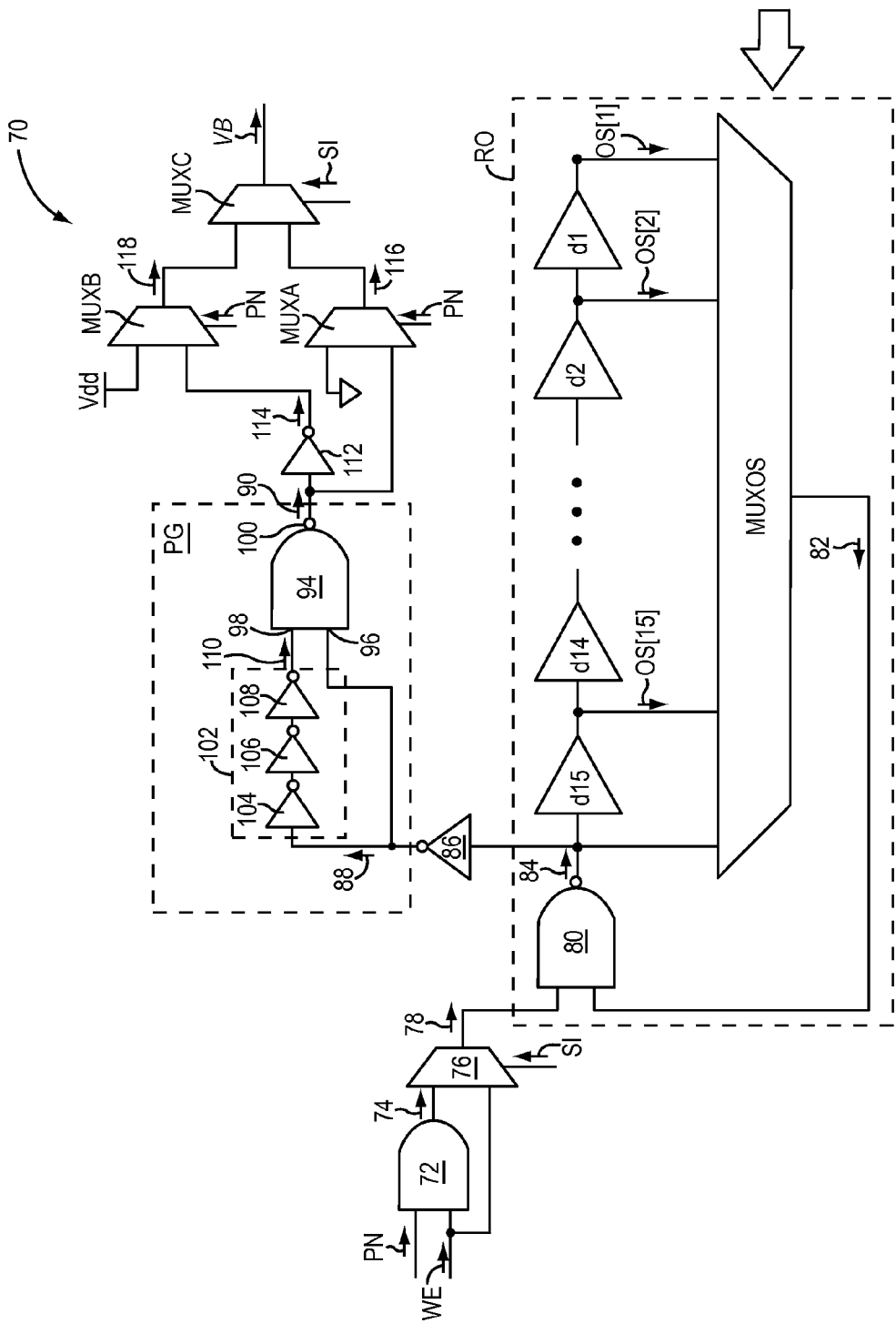
FIG. 5 illustrates one embodiment of a write circuit that may be provided in each of the bit line drivers shown in FIG. 1 in order to generate a bit line voltage that provides a set of positive pulses when the digital vector value $r_i$ is positive and a set of negative pulses when the digital vector value $r_i$ is negative.

FIG. 5 illustrates one embodiment of a write circuit 70 that may be provided in each of the bit line controllers 24 shown in FIG. 1 in order to generate the bit line voltage VB to provide a set of positive pulses when the digital vector value $r_i$ is positive and a set of negative pulses when the digital vector value $r_i$ is negative. The write circuit 70 is configured to receive the write enable signal WE, the digital vector value $r_i$ (represented as a standard 4-bit digital value), the write phase indication signal PN, and a sign signal SI. The sign signal SI indicates whether the digital vector value $r_i$ is positive or negative.

The write circuit 70 includes a ring oscillator RO. In this embodiment, an AND gate 72 and a multiplexer 76 provide polarity control for the ring oscillator RO. More specifically, the AND gate has an input terminal that receives the write phase indication signal PN and another input terminal that receives the write enable signal WE. The AND gate 72 thus generates a gated write enable signal 74. The output terminal of the AND gate 72 is coupled to an input terminal of a multiplexer 76. Thus, the multiplexer 76 receives the gated write enable signal 74. Another input terminal of the multiplexer 76 receives the write enable signal WE. The multiplexer 76 is configured to provide a resultant write enable signal 78 as either the gate write enable signal 74 or the write enable signal WE in accordance with the signal SI. The resultant write enable signal 78 thus provides polarity control for the ring oscillator RO.

The ring oscillator RO includes a NAND gate 80, delay elements d15-d1 and a multiplexer MUXOS. The NAND gate 80 is configured to receive the resultant write enable signal 78 at one input terminal and a selected oscillation signal 82 at another input terminal. The selected oscillation signal 82 is provided as feedback from an output terminal of the multiplexer MUXOS. The NAND gate 80 generates an oscillation signal 84 from an output terminal of the NAND gate 80. The delay element d15 is configured to receive the oscillation signal 84 from the output terminal of the NAND gate 80. The delay elements d15-d1 are coupled in series and each generates a corresponding delayed oscillation signal OS[15]-OS[1]. Each of the delay elements d15-d1 has a propagation delay and thus, the delayed oscillation signal OS[15]-OS[1] generated by delay elements d15-d1 further down the sequence have progressively greater delays. The input terminals of the multiplexer MUXOS are each configured to receive a corresponding one of the oscillation signals 84, OS[15]-OS[1]. The multiplexer MUXOS is configured to provide the selected oscillation signal 82 as one of the oscillation signals 84, OS[15]-OS[1] based on the digital vector value $r_i$ multiplexer MUXOS has with respect to the oscillation signal 84. Thus, the ring oscillator RO has a delay selected from sixteen different delay values, which are selected in accordance with the digital vector value $r_i$. The delay of the ring oscillator RO determines a temporal length of the oscillation period of the oscillation signal 84. Thus, the oscillation period of the oscillation signal 84 is selectable between sixteen different temporal lengths.

The oscillation signal 84 is received by an inverter 86 that generates an oscillation signal 88 that is inverted with respect to the oscillation signal 84 but has the same oscillation period as the oscillation signal 84. The oscillation signal 88 is received by a pulse generator PG. The pulsed clock generator PG is configured to generate a pulsed oscillation signal 90 from the oscillation signal 88. The pulsed clock generator PG includes an NAND gate 94 having an NAND gate input terminal 96, an NAND gate input terminal 98, and an NAND gate output terminal 100. The pulsed clock generator PG also includes a delay circuit 102, which in this embodiment includes an inverter 104, an inverter 106, and an inverter 108 coupled in series. The NAND gate 94 is configured to receive the oscillation signal 88 at the NAND gate input terminal 96, while the delay circuit 102 is configured to receive the oscillation signal 88 at the inverter 104.

The delay circuit 102 is configured to have a propagation delay $\Delta d$ and is thus configured to generate a delayed oscillation signal 110. The delayed oscillation signal 110 is received by the NAND gate 94 at the NAND gate input terminal 98. Note that the inverter 104, the inverter 106, and the inverter 108 in the delay circuit 102 provide an odd number of inversions. Consequently, the delayed oscillation signal 110 is inverted and delayed with respect to the oscillation signal 88 by the propagation delay $\Delta d$. The propagation delay $\Delta d$ is significantly shorter than a time duration t of an oscillation period of the oscillation signal 88. Thus, although the delayed oscillation signal 110 also has a oscillation period of the time duration t, the oscillation signal 88 and the delayed oscillation signal 110 overlap in the first clock state (which in this embodiment is high) for the propagation delay $\Delta d$. Consequently, the NAND gate 94 generates the pulsed oscillation signal 90 from the NAND gate output terminal 100 in the first clock state during an oscillation period having a time duration equal to the propagation delay $\Delta d$. The pulsed oscillation signal 90 thus has the same oscillation period as the oscillation signals 84, 88, 110. However, while a duty cycle of the oscillation signal 84, the oscillation signal 88, and the delayed oscillation signal 110 is approximately 50%; the propagation delay $\Delta d$ is significantly shorter than the oscillation period of the oscillation signal 84, the oscillation signal 88 and the delayed oscillation signal 110. However, a pulse is provided by the pulsed oscillation signal 90 every oscillation period. Thus, by selecting the temporal length of the oscillation period of the oscillation signal 84, a pulse rate of the pulsed oscillation signal 90 is adjusted. In this manner, a number of pulses of the pulsed oscillation signal 90 is set in accordance with the digital vector value $r_i$.

In this embodiment, the pulsed oscillation signal 90 is received by an inverter 112 that is configured to receive the pulsed oscillation signal 90 and generate an inverted pulsed oscillation signal 114 that is inverted with respect to the pulsed oscillation signal 90. A multiplexer MUXA has an input terminal coupled to receive the pulsed oscillation signal 90 and an input terminal that receives a ground voltage, which in this example provides the low voltage state. A multiplexer MUXA has an input terminal coupled to receive the pulsed oscillation signal 90 and an input terminal that receives a ground voltage, which in this example provides the low voltage state. The multiplexer MUXA provides a selected output signal 116 at its output terminal as either the pulsed oscillation signal 90 or the ground voltage based on the write phase indication signal PN. A multiplexer MUXB has an input terminal coupled to receive the inverted pulsed oscillation signal 114 and an input terminal that receives a supply voltage Vdd, which in this example provides the high voltage state. The multiplexer MUXB provides a selected output signal 118 at its output terminal as either the pulsed oscillation signal 90 or the ground voltage based on the write phase indication signal PN. A multiplexer MUXC has an input terminal coupled to receive the selected output signal 116 and an input terminal coupled to receive the selected output signal 118. The multiplexer MUXC provides the bit line voltage B at its output terminal as either the selected output signal 116 or the selected output signal 118 based on the sign signal SI.

Thus in the positive phase of the write period, if vector value $r_i$ is positive, the bit line voltage VB is provided as a set of positive pulses proportional in number to a magnitude of the vector value $r_i$. In the positive phase of the write period, if the vector value $r_i$ is negative, the bit line voltage VB is kept at ground (e.g. 0 Volts) during the positive phase of the write period, ensuring no change in the combined variable conductance of the corresponding subarray of the resistive elements R shown in FIG. 1. Similarly in the negative phase of the write period, if vector value $r_i$ is positive, the bit line voltage VB is kept at the supply voltage Vdd to ensure no change in the combined variable conductance of the corresponding subarray of the resistive elements R shown in FIG. 1. On the other hand, in the negative phase of the write period, if vector value $r_i$ has a negative value, a set of negative pulses proportional in number to a magnitude of the vector value $r_i$ are generated.

Figure 6:
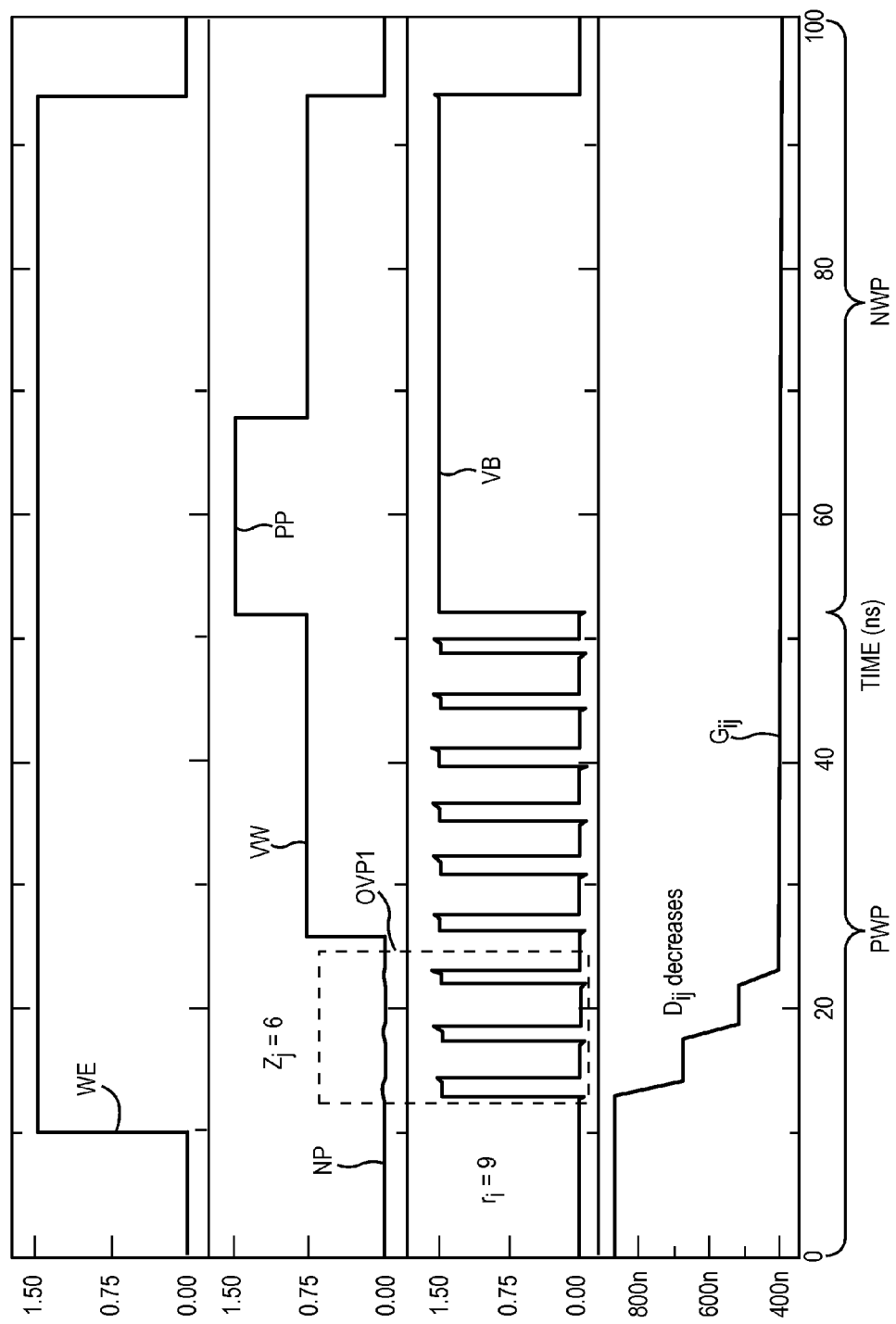
FIG. 6 illustrates an exemplary timing diagram of a write period where the write circuit shown in FIG. 4 and the write circuit shown in FIG. 5 are utilized to adjust a combined variable conductance $G_{ij}$ of a 3×3 subarray of the resistive elements R shown in FIG. 1.

FIG. 6 illustrates an exemplary timing diagram of a write period where the write circuit 49 shown in FIG. 4 and the write circuit 70 shown in FIG. 5 are utilized to adjust a combined variable conductance $G_{ij}$ of a 3×3 subarray of the resistive elements R shown in FIG. 1 based on the product of $Z_j \cdot r_i$ when the vector value is $r_i$ positive. In this example, the vector value $Z_j$ is equal to six and the vector value $r_i$ is equal to nine. The supply voltage Vdd is provided at 1.5 Volts and ground is provided at zero volts. The write enable signal WE is provided at the supply voltage Vdd of 1.5 volts during the write period.

Thus, in the positive phase of the write period, the word line voltage VW is provided with a negative pulse NP during the positive phase PWP of the write period. The pulse duration of the negative pulse NP is set in accordance with the vector value $Z_j$. The word line voltage VW is then set to the intermediate voltage state provided by Vdd/2 at 0.75 Volts for the remainder of the positive phase PWP. The word line voltage VW is provided with a positive pulse PP during the negative phase NWP of the write period. The pulse duration of the positive pulse PP is set in accordance with the vector value $Z_j$. The word line voltage VW is then set to the intermediate voltage state provided by Vdd/2 at 0.75 Volts for the remainder of the negative phase NWP.

Since the vector value $r_i$ is positive, the bit line voltage VB is provided as a set of nine positive pulses, which is determined by the vector value $r_i$, during the positive phase PWP of the write period. During the negative phase NWP of the write period, the bit line voltage VB is provided at the supply voltage Vdd of 1.5 Volts. The set of positive pulses of the bit line voltage VB and the negative pulse NP of the word line voltage VW are thus partially aligned in the overlap time period OVP1 during the negative phase NWP. The combined variable conductance $G_{ij}$ is thus increased in accordance with a time duration of the overlap time period OVP1. The time duration of the overlap time period OVP1 thus represents a decrease in the matrix value $D_{ij}$ (represented by the combined variable conductance $G_{ij}$), which is determined by the product $Z_j \cdot r_i$ as explained above.

Figure 7:
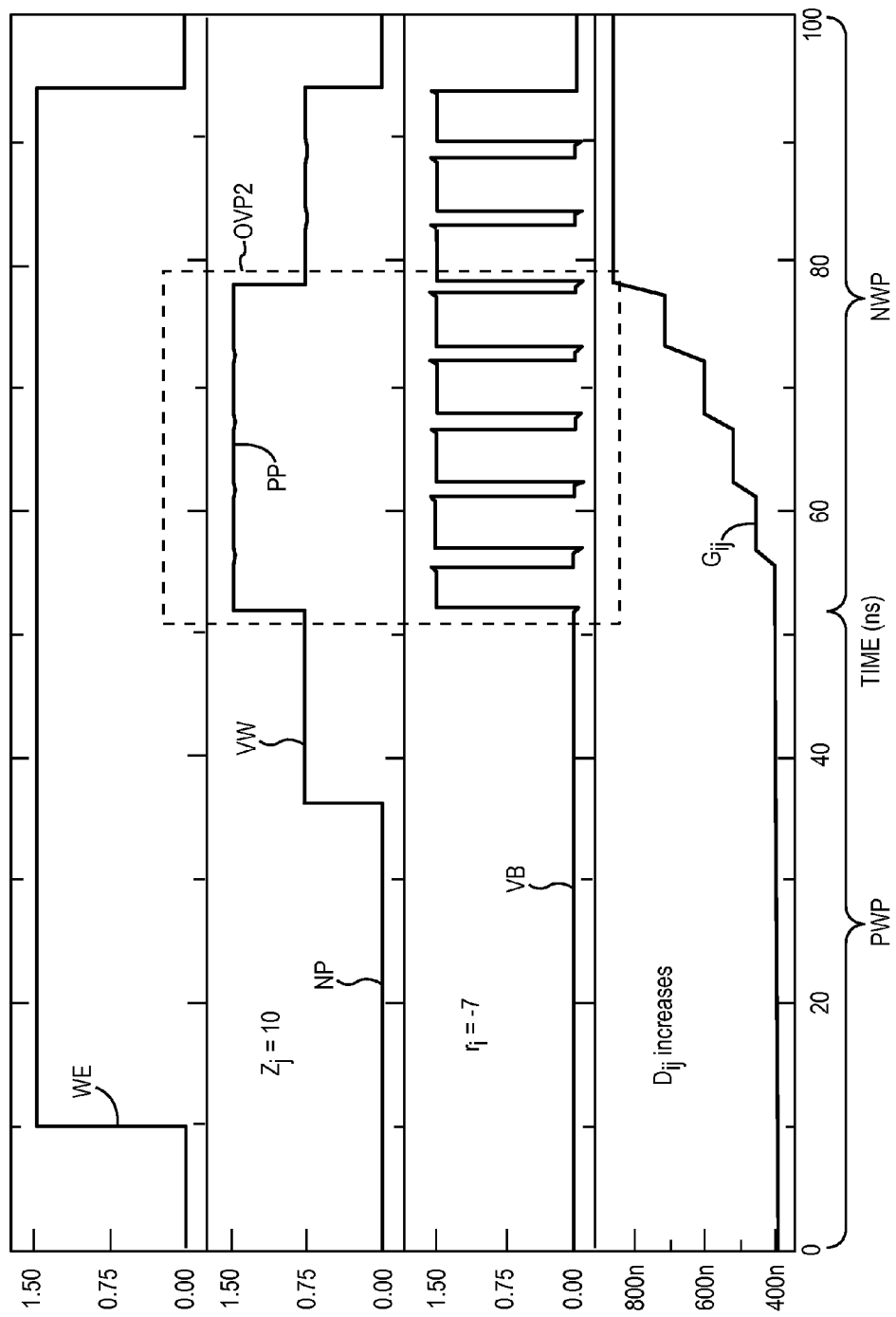
FIG. 7 illustrates an exemplary timing diagram of a write period where the write circuit shown in FIG. 4 and the write circuit shown in FIG. 5 are utilized to adjust a combined variable conductance $G_{ij}$ of a 3×3 subarray of the resistive elements R shown in FIG. 1 based on the product of $Z_j*r_i$ when the vector value is $r_i$ negative.

FIG. 7 illustrates an exemplary timing diagram of a write period where the write circuit 49 shown in FIG. 4 and the write circuit 70 shown in FIG. 5 are utilized to adjust a combined variable conductance $G_{ij}$ of a 3×3 subarray of the resistive elements R shown in FIG. 1 based on the product of $Z_j \cdot r_i$ when the vector value is $r_i$ negative. In this example, the vector value $Z_j$ is equal to ten and the vector value $r_i$ is equal to negative seven. The supply voltage Vdd is provided at 1.5 Volts, and ground is provided at zero volts. The write enable signal WE is provided at the supply voltage Vdd of 1.5 volts during the write period.

Thus, in the positive phase of the write period, the word line voltage VW is provided with the negative pulse NP during the positive phase PWP of the write period. The pulse duration of the negative pulse NP is set in accordance with the vector value $Z_j$. The word line voltage VW is then set to the intermediate voltage state provided by Vdd/2 at 0.75 Volts for the remainder of the positive phase PWP. The word line voltage VW is provided with the positive pulse PP during the negative phase NWP of the write period. The pulse duration of the positive pulse PP is set in accordance with the vector value $Z_j$. The word line voltage VW is then set to the intermediate voltage state provided by Vdd/2 at 0.75 Volts for the remainder of the negative phase NWP.

Since the vector value $r_i$ is negative, the bit line voltage VB is provided at the ground during the positive phase PWP of the write period. The bit line voltage VB is provided as a set of seven negative pulses, which is determined by the magnitude of the vector value $r_i$, during the negative phase NWP of the write period. The set of negative pulses of the bit line voltage VB and the positive pulse PP of the word line voltage VW are thus partially aligned in the overlap time period OVP2 during the negative phase NWP. The combined variable conductance $G_{ij}$ is thus decreased in accordance with a time duration of the overlap time period OVP2. The time duration of the overlap time period OVP2 thus represents an increase in the matrix value $D_{ij}$ (represented by the combined variable conductance $G_{ij}$), which is determined by the product $Z_j \cdot r_i$ as explained above.

Figure 8:
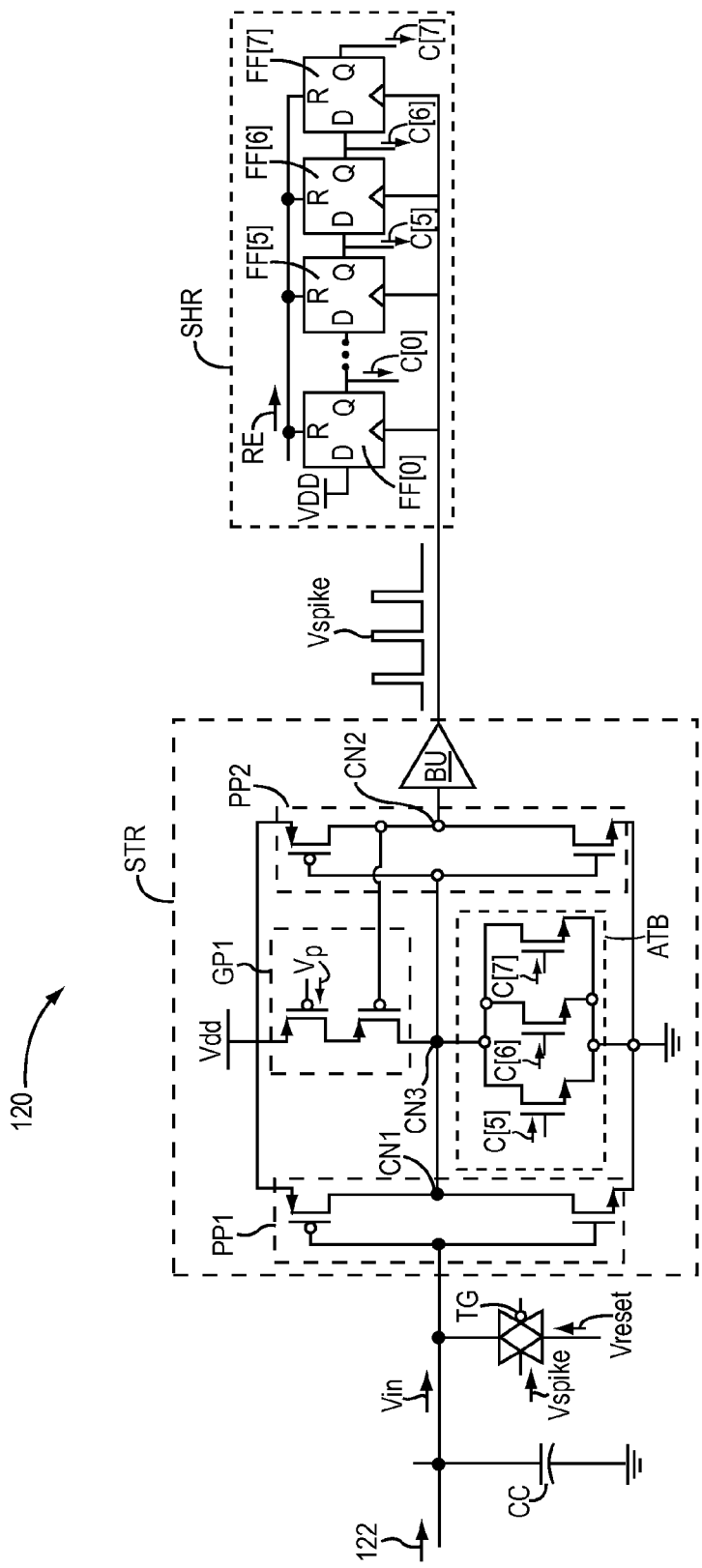
FIG. 8 illustrates one embodiment of a read circuit, which may be provided in each of the word line drivers and each of the bit line drivers shown in FIG. 1 to read line currents during read operations.

An exemplary embodiment of a read circuit 120 is shown in FIG. 8. The read circuit 120 may be provided in each of the word line controllers 22 and each of the bit line controllers 24 shown in FIG. 1. In FIG. 8, the read circuit 120 is configured to receive a line current 122, which may be one of the word line currents IZ or the bit line current IR shown in FIG. 1 depending on whether the read circuit is provided in one of the word line controllers 22 and/or in one of the bit line controllers 24 shown in FIG. 1. In principle, this output response is similar to that of a biological neuron model, namely Integrate-and-Fire. The read circuit 120 includes a capacitor CC, a pass gate TG, a Schmitt trigger circuit STR, and a shift register SHR. The line current 122 charges the capacitor CC, which integrates the line current 122 to generate the input voltage Vin. The pass gate TG and the Schmitt trigger circuit STR are configured so that when the line current 122 charges the input voltage Vin above a certain threshold voltage magnitude, the Schmitt trigger circuit STR switches a pulsed voltage Vspike and the capacitor CC is discharged back to a reset voltage Vreset by the pass gate TG. The pass gate TG is configured to receive the reset voltage Vreset and is synchronized by the voltage Vspike. In one embodiment, the reset voltage Vreset and the threshold voltage level are 500 mV and 530 mV, respectively. The Schmitt trigger circuit STR is provided due to its high sensitivity to small changes in voltages and thereby provides Integrate-and-Fire operation.

The number of voltage pulses generated in the in the pulsed voltage Vspike is determined by a current level of the line current 122, since the number of times that the input voltage Vin crosses the threshold voltage level is inversely proportional to the current level. In this embodiment, the Schmitt trigger circuit STR has a first push pull transistor pair PP1 configured to receive the input voltage Vin. A second push pull transistor pair PP2 is configured to receive a common node CN1 of the first push pull transistor pair PP1. A common node CN2 of the second push pull transistor pair PP2 is coupled to a buffer BU, which is configured to generate the pulsed voltage Vspike. A stack of gating transistors GP1 is coupled between the supply voltage Vdd and the common node CN1. An adaptive threshold block ATB is coupled between the common node CN1 and ground. The pulsed voltage Vspike is received by the shift register SHR. The shift register SHR includes flip flops FF[0]-FF[7], which are sequentially connected. Each of the flip flops FF[0]-FF[7] has a clock terminal that receives the pulsed voltage Vspike. The D input terminal of the flip flop FF[0] receives the supply voltage Vdd, which represents a logical "1". At the output terminal Q of each the flip flops FF[0]-FF[8], each of the flip flops is configured to generate a corresponding one of the bit signals C[0]-C[7], which represent an output bit of a digital vector value made up from the bit signals C[0]-C[7]. A D terminal of each of the flip flops FF[1]-FF[7] is configured to receive the bit signal C[0]-C[7] from a previous one of the flip flops FF[1]-FF[6] in the sequence of flip flops FF[1]-FF[7]. In this manner, for every voltage pulse of the pulsed voltage Vspike, logical "1" is sequenced down the flip flops FF[1]-FF[7]. Thus, the shift register SHR provides an analog to digital conversion, where the number of the bit signal C[0]-C[7] that is provided at logical "1" after a read window indicates the resultant vector value. A read enable signal RE is provided to the reset terminals of each of the flip flops FF[1]-FF[7]. When the read enable signal RE is provided in the high voltage state, the flip flops FF[1]-FF[7] are each reset so that another digital vector value can be provided during another read window.

The adaptive threshold block ATB is provided in the Schmitt trigger to adjust the threshold voltage level when the line current 122 is high. This is provided to ensure high linearity between the number of voltage pulses in the pulsed voltage Vspike and the combined variable conductances at high current levels. The adaptive threshold block ATB includes parallel transistors coupled between the common node CN1 and ground. Each of the parallel transistors is configured to receive one of the bit signals C[5], C[6], and C[7], which will be provided at logical "1" when the line current 122 is high.

Figure 9A:
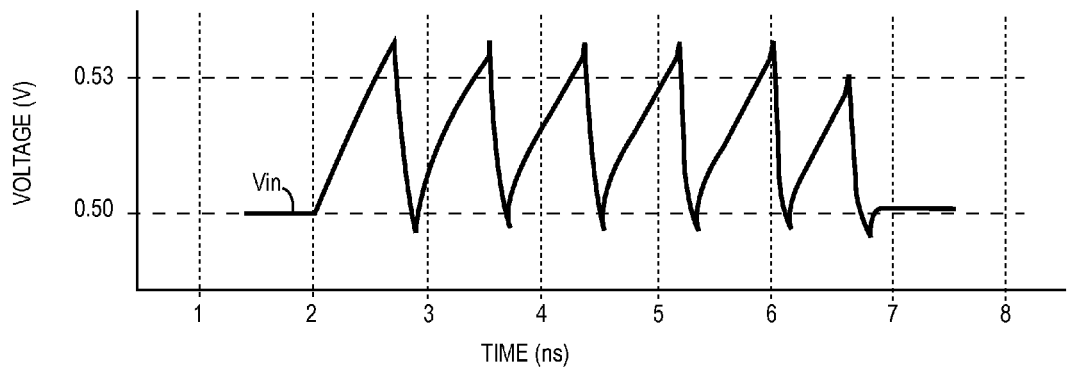
FIG. 9A illustrates an example of the input voltage generated by the read circuit shown in FIG. 8 when the line current has a current level of 6.5 µA.
Figure 9B:
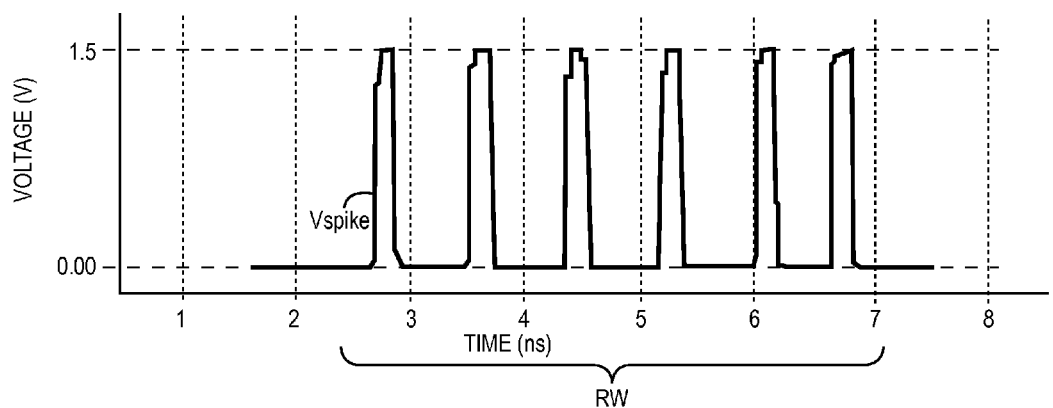
FIG. 9B illustrates an example of the pulsed voltage generated by the read circuit shown in FIG. 8, when the line current (shown in FIG. 8) has a current level of 6.5 µA.

Referring now to FIG. 9A and FIG. 9B, FIG. 9A illustrates an example of the input voltage Vin generated by the read circuit 120 shown in FIG. 8, and FIG. 9B illustrates an example of the pulsed voltage Vspike generated by the read circuit 120 shown in FIG. 8, when the line current 122 (shown in FIG. 8) has a current level of 6.5 µA. In this embodiment, the reset voltage Vreset (shown in FIG. 8) and the threshold voltage level are 500 mV and 530 mV, respectively. Note that the input voltage Vin crosses the threshold voltage level of 530 mV six times. This results in six voltage pulses in the pulsed voltage Vspike during the read window RW, which is approximately 4.8 ns. Note that the threshold voltage level was adjusted slightly by the adaptive threshold block ATB (shown in FIG. 8) after the fifth time the input voltage Vin crosses the threshold voltage level.

Figure 10A:
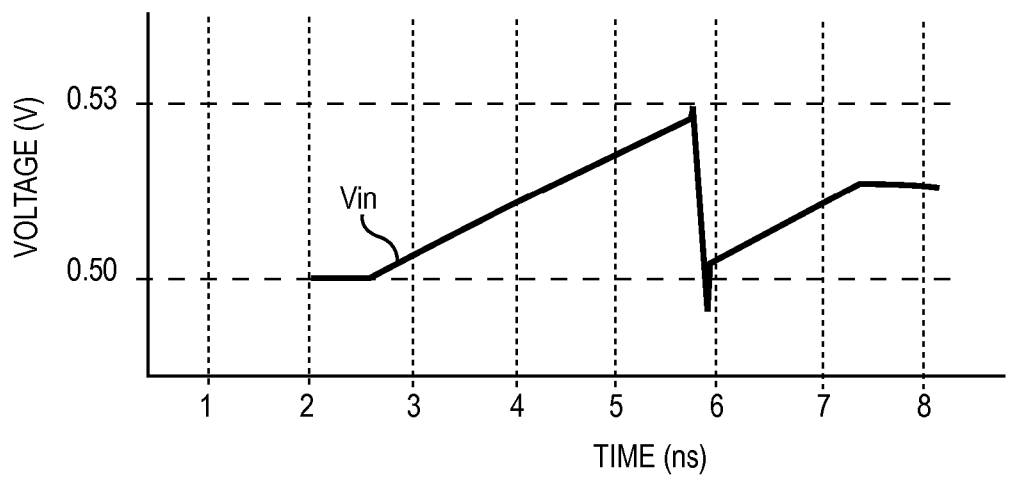
FIG. 10A illustrates an example of the input voltage generated by the read circuit shown in FIG. 8 when the line current (shown in FIG. 8) has a current level of 1.1 µA.
Figure 10B:
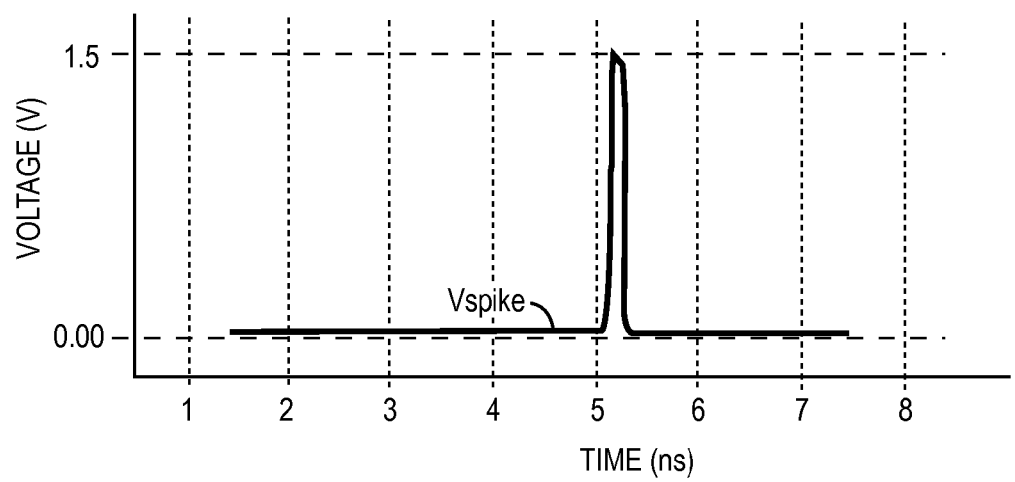
FIG. 10B illustrates an example of the pulsed voltage generated by the read circuit shown in FIG. 8, when the line current (shown in FIG. 8) has a current level of 1.1 µA.

Referring now to FIG. 10A and FIG. 10B, FIG. 10A illustrates an example of the input voltage Vin generated by the read circuit 120 shown in FIG. 8, and FIG. 10B illustrates an example of the pulsed voltage Vspike generated by the read circuit 120 shown in FIG. 8, when the line current 122 (shown in FIG. 8) has a current level of 1.1 µA. Note that the input voltage Vin crosses the threshold voltage level of 530 mV one time. This results in one voltage pulse in the pulsed voltage Vspike during the read window RW, which is approximately 4.8 ns. With respect to FIGS. 9A, 9B, 10A, 10B, the granularity of the read circuit 120 (shown in FIG. 8) with respect to the line current 122 (shown in FIG. 8) is approximately 1 µA.

Figure 11:
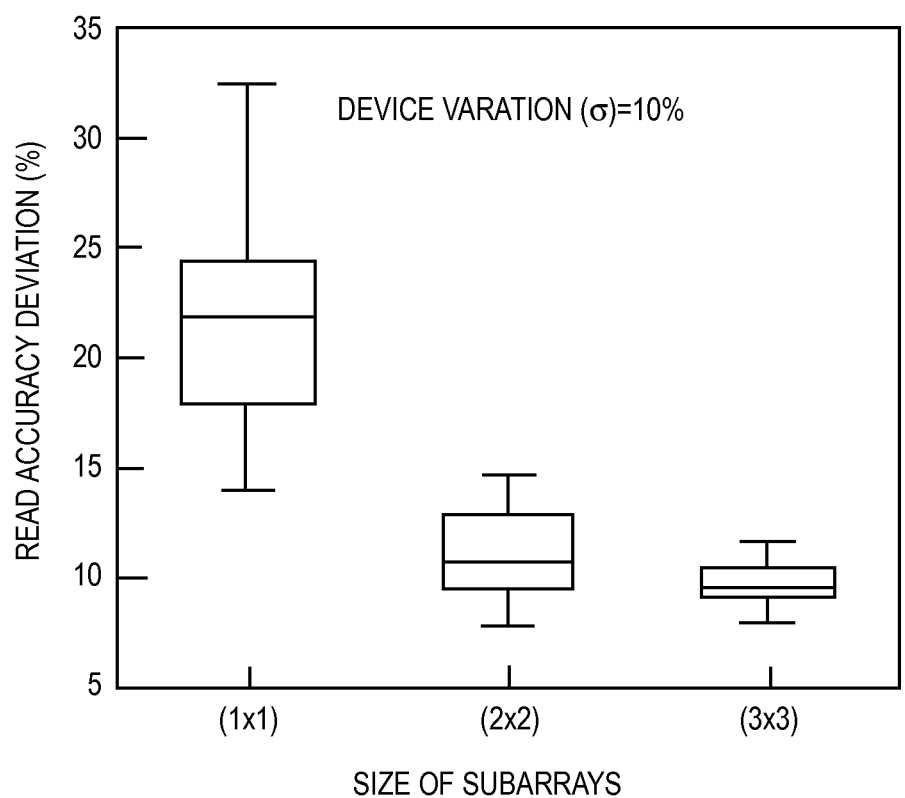
FIG. 11 illustrates read accuracy as a function of the size of the subarrays used to provide variable conductances.

FIG. 11 illustrates the read accuracy deviation as a function of the size of the subarrays used to provide variable conductances to represent the matrix value of the matrix D. As shown in FIG. 11, 3×3 subarrays significantly improve the read accuracy. This is so, despite the device variation having a standard deviation of approximately 10%.

Figure 12:
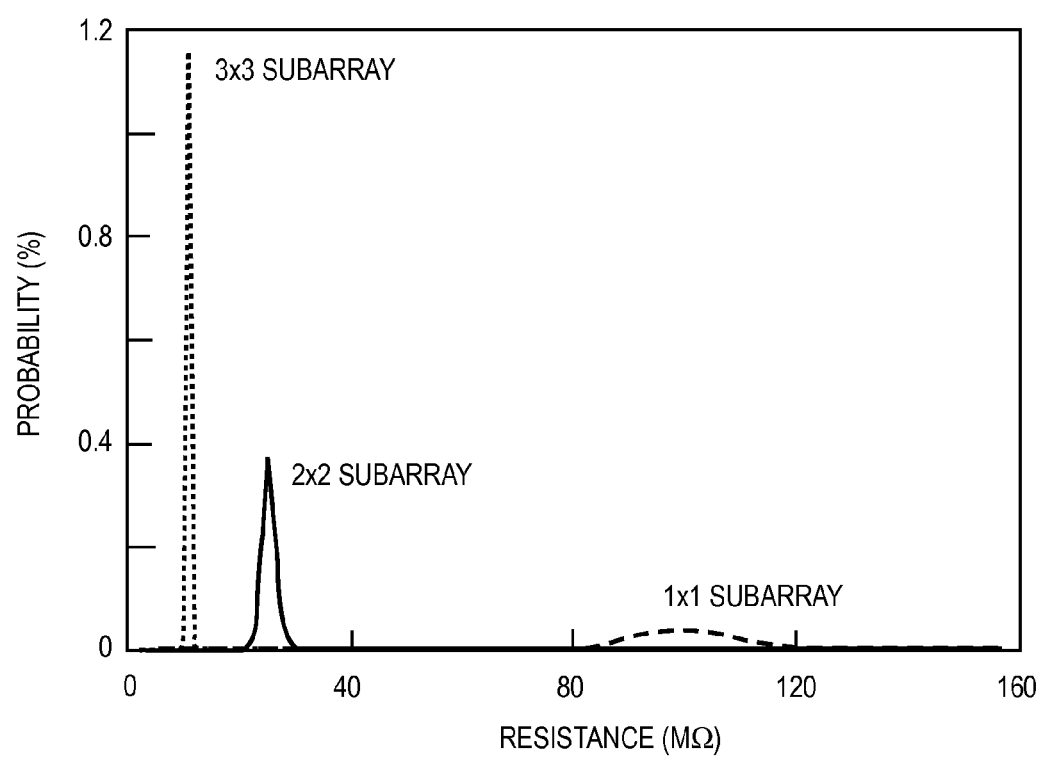
FIG. 12 illustrates the resistance distribution of the variable resistance (and thus the variable conductance) as a function of the size of the subarrays used to provide variable conductances.

FIG. 12 illustrates the resistance distribution of the variable resistance (and thus the variable conductance) as a function of the size of the subarrays used to provide variable conductances to represent the matrix value of the matrix D. As shown in FIG. 12, using multiple resistive elements R (shown in FIG. 1) to provide a combined variable resistance averages process variation of the individual resistive elements R (shown in FIG. 1). For 3×3 subarrays, the resistance variation of the combined variable resistance is less than 1%.

Those skilled in the art will recognize improvements and modifications to the preferred embodiments of the present disclosure. All such improvements and modifications are considered within the scope of the concepts disclosed herein and the claims that follow.

What is claimed is:
1. A resistive memory system comprising:
a cross point resistive network comprising variable resistive elements and conductive lines coupled to the variable resistive elements such that the conductive lines and the variable resistive elements form the cross point resistive network; and
a plurality of switchable paths connected to the conductive lines so that the plurality of switchable paths are operable to selectively interconnect a group of the conductive lines such that a set of the variable resistive elements provide a combined variable conductance wherein the plurality of switchable paths are operable to selectively interconnect different combinations of the conductive lines of the variable resistive elements so that the set of the variable resistive elements is reconfigurable as different combinations of the variable resistive elements.

2. The resistive memory system of claim 1 wherein the plurality of switchable paths are operable so as to selectively interconnect the different combinations of the conductive lines of such that the different combinations of the set of the variable resistive elements include a first combination of all of the variable resistive elements and at least one other combination that is a subset of the variable resistive elements.

3. The resistive memory system of claim 1 wherein the plurality of switchable paths are connected to the conductive lines such that the plurality of switchable paths are operable to selectively interconnect subgroups of the conductive lines so that subsets of the variable resistive elements within the cross point resistive network and provide the combined variable conductances, each subset of the variable resistive elements providing a corresponding combined variable conductance of the combined variable conductances.

4. The resistive memory system of claim 3 wherein the plurality of switchable paths are operable to selectively interconnect the subgroups of the conductive lines so that the subsets are reconfigurable as different combinations of the variable resistive elements of the subsets of the variable resistive elements.

5. The resistive memory system of claim 4 wherein the variable resistive elements comprise resistive random access memory (RRAM) elements.

6. The resistive memory system of claim 1 wherein the conductive lines comprise word lines and bit lines, wherein each of the variable resistive elements is coupled between a corresponding one of the word lines and a corresponding one of the bit lines such that the cross point resistive network is a cross point resistive array.

7. The resistive memory system of claim 6 wherein the plurality of switchable paths comprise:
   switchable word line interconnection paths, wherein each of the switchable word line interconnection paths is connected between a different pair of the word lines;
   switchable bit line interconnection paths, wherein each of the switchable bit line interconnection paths is connected between a different pair of the bit lines; and
   wherein each of the switchable word line interconnection paths and the switchable bit line interconnection paths are configured to be opened and closed such that different combinations of subarrays of the variable resistive elements are selectively interconnected so that each of the subarrays of the variable resistive elements provide a corresponding combined variable conductance of a plurality of combined variable conductances provided by the subarrays within the cross point resistive array.

8. The resistive memory system of claim 7 further comprising:
   word line control circuitry;
   bit line control circuitry; and
   wherein the word line control circuitry is configured to generate a word line output onto the word lines and the bit line control circuitry is configured to generate a bit line output onto the bit lines such that each of the plurality of combined variable conductances provided by the subarrays is adjustable in parallel.

9. The resistive memory system of claim 8 wherein the word line control circuitry is configured to generate the word line output as word line voltages that represent a first vector by providing each of the word line voltages with a negative pulse and a positive pulse with pulse durations set in accordance to a corresponding vector value of the first vector.

10. The resistive memory system of claim 9 wherein the bit line control circuitry is configured to generate the bit line output as bit line voltages representing a second vector by providing each of the bit line voltages with a set of pulses such that, for each of the bit line voltages a number of the set of pulses is set in accordance to a corresponding vector value of the second vector.

11. The resistive memory system of claim 10 wherein the bit line control circuitry is configured such that for each of the bit line voltages, the set of pulses comprises a set of positive pulses that at least partially temporally align with the negative pulse of a corresponding one of the word line voltages.

12. The resistive memory system of claim 10 wherein the bit line control circuitry is configured such that for each of the bit line voltages, the set of pulses comprises a set of negative pulses that at least partially temporally align with the positive pulse of a corresponding one of the word line voltages.

13. The resistive memory system of claim 10 wherein the bit line control circuitry is configured such that for each of the bit line voltages, the set of pulses is provided by the bit line control circuitry as a set of positive pulses that at least partially temporally align with the negative pulse of a corresponding one of the word line voltages in response to the corresponding vector value of the second vector being positive, and the set of pulses is provided by the bit line control circuitry a set of negative pulses that at least partially temporally align with the positive pulse of the corresponding one of the word line voltages in response to the corresponding vector value of the second vector being negative.

14. The resistive memory system of claim 7 further comprising:
   word line control circuitry configured to generate word line voltages such that each of the word line voltages represents a different value of a vector, and to apply the word line voltages, a different row of the subarrays receives a different one of the word line voltages; and
   bit line control circuitry configured to receive bit line currents generated in response to the word line voltages, wherein each of the bit line currents is generated by a different column of the subarrays.

15. The resistive memory system of claim 7 further comprising:
   bit line control circuitry configured to generate bit line voltages such that each of the bit line voltages represents a different value of a vector, and to apply the bit line voltages, a different column of the subarrays receives a different one of the bit line voltages; and
   word line control circuitry configured to receive word line currents generated in response to the bit line voltages, wherein each of the word line currents is generated by a different row of the subarrays.

16. The resistive memory system of claim 6 wherein the plurality of switchable paths comprise:
   a switchable word line interconnection path connected between a pair of the word lines;
   a switchable bit line interconnection path connected between a pair of the bit lines; and wherein the switchable word line interconnection path and the switchable bit line interconnection path are configured to be closed such that the set of the variable resistive elements is a subarray of the variable resistive elements within the cross point resistive array, which provide the combined variable conductance.

17. The resistive memory system of claim 1 further comprising switch control circuitry configured to open and close the plurality of switchable paths.

* * * * *

UNITED STATES PATENT AND TRADEMARK OFFICE
CERTIFICATE OF CORRECTION

PATENT NO. : 9,466,362 B2
APPLICATION NO. : 14/824782
DATED : October 11, 2016
INVENTOR(S) : Shimeng Yu et al.

It is certified that error appears in the above-identified patent and that said Letters Patent is hereby corrected as shown below:

In the Specification

In Column 14, Line 44, replace "S (j) = j + j-1) *2" with --S (j) = j + (j-1) *2--.

Signed and Sealed this
Third Day of January, 2017

Michelle K. Lee
*Director of the United States Patent and Trademark Office*